(12) United States Patent
Konishi

(10) Patent No.: US 6,501,671 B2
(45) Date of Patent: Dec. 31, 2002

(54) SEMICONDUCTOR MEMORY DEVICE ENABLING SELECTIVE PRODUCTION OF DIFFERENT SEMICONDUCTOR MEMORY DEVICES OPERATING AT DIFFERENT EXTERNAL POWER-SUPPLY VOLTAGES

(75) Inventor: Yasuhiro Konishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 131 days.

(21) Appl. No.: 09/793,996

(22) Filed: Feb. 28, 2001

(65) Prior Publication Data

US 2002/0001218 A1 Jan. 3, 2002

(30) Foreign Application Priority Data

Jun. 30, 2000 (JP) ........................................ 2000-198654

(51) Int. Cl.[7] ................................................ G11C 5/06
(52) U.S. Cl. ......................... 365/63; 365/226; 327/530
(58) Field of Search .................. 365/63, 226; 327/530, 327/541, 500, 540

(56) References Cited

U.S. PATENT DOCUMENTS 5,297,097 A * 3/1994 Etoh et al. .................. 365/226
6,351,179 B1 * 2/2002 Ikehashi et al. ............. 327/541

FOREIGN PATENT DOCUMENTS

JP           8-330552       12/1996
JP           9-82929        3/1997

* cited by examiner

*Primary Examiner*—David Nelms
*Assistant Examiner*—Connie C. Yoha
(74) *Attorney, Agent, or Firm*—McDermott, Will & Emery

(57) ABSTRACT

Common circuit includes inactivation/activation circuits. Exclusive circuits include inverters IV3, IV4, IV5 and IV6 at the input portions thereof. When an SDR-SDRM is to be produced, inactivation/activation circuit outputs an inactivation signal DASL fixed to a ground voltage to exclusive circuit, while inactivation/activation circuit outputs a signal /OE inverted from an output enable signal OE to exclusive circuit. Inverters IV5 and IV6 in exclusive circuit then output a signal based on the signal /OE. Further, an N-channel MOS transistor and a P-channel MOS transistor in exclusive circuit are completely turned off, so that no through current flows from a power-supply node to a ground terminal in exclusive circuit. As a result, generation of the through current is prevented in an inactivated circuit.

13 Claims, 14 Drawing Sheets

SEMICONDUCTOR MEMORY DEVICE ENABLING SELECTIVE PRODUCTION OF DIFFERENT SEMICONDUCTOR MEMORY DEVICES OPERATING AT DIFFERENT EXTERNAL POWER-SUPPLY VOLTAGES

BACKGROUND OF THE INVENTION

1. Field of the Invention

The present invention relates to a semiconductor memory device, and in particular to a semiconductor memory device which enables selective production of different semiconductor memory devices operating at different external power-supply voltages.

2. Description of the Background Art

General-purpose DRAMs (Dynamic Random Access Memory), that have been wide spread as semiconductor memory devices, include SDR (Single Data Rate)-SDRAMs (synchronous-DRAMs), each of which transmits data, an address signal and a control signal to/from an external source in synchronization with a rise of an external clock, and DDR (Double Data Rate)-SDRAMs, each of which transmits data, an address signal and a control signal to/from an external source in synchronization with both the rise and a fall of the external clock. The DDR-SDRAMs have been made to attain improved performance by making a transfer rate thereof twice as fast as that of the SDR-SDRAMs.

An SDR-SDRAM is different from a DDR-SDRAM not only in the transfer rate of data or the like, but also in a power-supply voltage and an interface. Currently, the power-supply voltage and a power-supply voltage for output of the SDR-SDRAM are 3.3V and the interface is LVTTL (Low Voltage-TTL) for 3.3V. On the other hand, the power-supply voltage and the power-supply voltage for output of the DDR-SDRAM is 2.5V, and the interface is SSTL-2 (Stub Series Terminated Logic) for 2.5V.

With development of high-density DRAMs, a semiconductor process has come to involve more miniaturization process, and thus a break-down voltage of a gate oxide film of an MOS transistor has been reduced. This requires reduction of an operating voltage in order to attain higher reliability of the DRAMs. However, a personal computer as a main application product of the DRAMs utilizes, in a system with one standard, a plurality of generations of DRAMs, making it difficult to reduce the operation voltage of DRAM. Thus, in order to address the problem described above, a voltage down converter is provided within a chip in a DRAM, for an example, to reduce an external power-supply voltage of 3.3V to an internal power-supply voltage of 2.5V. As a result, the SDR-SDRAM is supplied with the external power-supply voltage of 3.3V, and is operated at the internal power-supply voltage of 2.5V which is down-converted from the external power-supply voltage of 3.3V by the voltage down converter. The DDR-SDRAM is supplied with the external power-supply; voltage of 2.5V to be operated.

It is then necessary to produce different products with different power-supply voltages for the SDR-SDRAMs and for the DDR SDRAMs when DRAMs are produced, while both of the SDR-SDRAM and the DDR-SDRAM are around in the market.

Though an SDR-SDRAM and a DDR-SDRAM are different in their interfaces, many parts in memory cores are common. Thus, a semiconductor memory device can be designed, in consideration of its productivity, such that an SDR-SDRAM and a DDR-SDRAM can be selectively produced, for example, by simply replacing a metal mask. An internal circuit of the SDRAM is divided into three parts as follows: (1) a part usable for both SDR and DDR, (2) a part used only for SDR, and (3) a part used only for DDR. When the SDR-SDRAM is to be produced, (2) the part used only for SDR is activated and (3) the part used only for DDR is inactivated. When, on the other hand, the DDR-SDRAM is to-be produced, (2) the part used only for SDR is inactivated and (3) the part used only for DDR is activated.

Thus, as shown in FIG. 19, a semiconductor memory device 500 enabling selective production of the SDR-SDRAM and the DDR-SDRAM includes a switch 120, a common circuit 130, exclusive circuits 140 and 150, an external power-supply line 160, an internal power-supply line 170, a power-supply line 180 and a voltage down converter 190.

When the DDR-SDRAM operated at the external power-supply voltage of 2.5V is to be produced, switch 120 is connected to external power-supply line 160 by a metal mask, and when the SDR-SDRAM operated at the internal power-supply voltage of 2.5V which has been down-converted from the external power-supply voltage of 3.3V is to be produced, it is connected to internal power-supply line 170 by the metal mask. Common circuit 130 is connected to power-supply line 180 and is operated at the external power-supply voltage of 2.5V and the internal power-supply voltage of 2.5V which has been down-converted from the external power-supply voltage of 3.3V. Exclusive circuit 140 is connected to internal power-supply line 170 and is operated at the internal power-supply voltage of 2.5V only when the external power-supply voltage of 3.3V is supplied thereto. Exclusive circuit 150 is connected to external power-supply line 160 and is operated only at the external power-supply voltage-of 2.5V.

External power-supply line 160 supplies the external power-supply voltage of 2.5V or 3.3V to switch 120, exclusive circuit 150 and voltage down converter 190. Internal power-supply line 170 is connected to voltage down converter 190 to supply the internal power-supply voltage of 2.5V which has been down-converted by voltage down converter 190 to switch 120 and exclusive circuit 140.

Voltage down converter 190 down-converts the external power-supply voltage of 3.3V, supplied from external power-supply line 160, to the internal power-supply voltage of 2.5V.

When external power-supply line 160 is supplied with the external power-supply voltage of 3.3V, i.e., when the SDR-SDRAM is produced, voltage down converter 190 down-converts the external power-supply voltage of 3.3V to the internal power-supply voltage of 2.5V, and supplies the down-converted voltage to internal power-supply line 170. Switch 120 is connected to internal power-supply line 170 by the metal mask. Then, common circuit 130 and exclusive circuit 140 are supplied with the internal power-supply voltage, and common circuit 130 inputs/outputs various signals to/from exclusive circuit 140, for writing and reading data. Exclusive circuit 150 operated only at the external power-supply voltage of 2.5V is then inactivated by an inactivation signal from common circuit 130, and is supplied with the external power-supply voltage of 3.3V by external power-supply line 160.

On the other hand, when external power-supply line 160 is supplied with the external power-supply voltage of 2.5V, i.e., when the DDR-SDRAM is produced, internal power-supply line 170 to which exclusive circuit 140 is connected is further connected to external power-supply line 160 by a switch (not shown), and exclusive circuit 140 is supplied with the external power-supply voltage of 2.5V. Further, switch 120 is connected to external power-supply line 160. Then, common circuit 130 and exclusive circuit 150 are supplied with the external power-supply voltage of 2.5V. Common circuit 130 inputs/outputs various signals to/from exclusive circuit 150 for reading and writing data. Exclusive circuit 140 operated only at the external power-supply voltage of 3.3V is inactivated by an inactivation signal from common circuit 130.

However, if a signal of a level H (logical high) is output from common circuit 130 to exclusive circuit 150 in order to inactivate exclusive circuit 150 when SDR-SDRAM is to be produced, current disadvantageously flows through from external power-supply line 160 to a ground terminal (such current is hereinafter referred to as "through current") in exclusive circuit 150, making it impossible to produce a semiconductor memory device with low power consumption.

Referring to FIG. 20, common circuit 130 includes an inverter 135 provided between a power-supply node 133 and a ground terminal 134. Inverter 135 includes a P-channel MOS transistor 131 and an N-channel MOS transistor 132. In inverter 135, a signal of a level L (logical low) is input from a node N20 and a signal of level H is output to a node N21. Power-supply node 133 is supplied with the internal power-supply voltage of 2.5V.

Exclusive circuit 150 includes inverters 156 and 159, each provided between a power-supply node 153 and a ground terminal 154. Inverter 156 includes a P-channel MOS transistor 151 and an N-channel MOS transistor 152. Inverter 159 includes a P-channel MOS transistor 157 and an N-channel MOS transistor 158. Power-supply node 153 is supplied with the external power-supply voltage of 3.3V.

In inverter 135 of common circuit 130, power-supply node 133 is supplied with the internal power-supply voltage of 2.5V, so that the signal of level H to be output to node N21 has a voltage of 2.5V. Thus, a voltage of 2.5V is input to inverter 156 in exclusive circuit 150. A voltage of 2.5V is then applied to the gate terminals of P-channel MOS transistor 151 and N-channel MOS transistor 152. P-channel MOS transistor 151 will not be completely turned off, but rather weakly turned on, since the external power-supply voltage of 3.3V is applied to the source terminal of the transistor. Further, N-channel MOS transistor 152 is turned on. As a result, through current 155 flows from power-supply node 153 to ground terminal 154 in inverter 156, and inverter 156 outputs a medium voltage between 0V and 3.3V to a node N22.

The medium voltage between 0V and 3.3V is input to inverter 159, so that P-channel MOS transistor 157 is weakly turned on and N-channel MOS transistor 158 is turned on. As a result, through current 161 also flows in inverter 159, from power-supply node 153 to ground terminal 154. Inverter 159 outputs a medium voltage between 0V and 3.3V to node N23.

Thus, a problem lies in that, when an inactivation signal of level H is output from common circuit 130 to exclusive circuit 150, through current flows between power-supply node 153 and ground terminal 154 in exclusive circuit 150.

When exclusive circuit 140 is inactivated to produce the DDR-SDRAM, no through current will flow in exclusive circuit 140 even if common circuit 130 outputs an inactivation signal of level H or L to exclusive circuit 140. Assuming that exclusive circuit 140 also includes inverters 156 and 159, common circuit 130 outputs a signal of level H having a voltage value of 2.5V, i.e., the external power-supply voltage, to exclusive circuit 140 as an inactivation signal. Power-supply node 153 is supplied with a voltage of 2.5V, so that P-channel MOS transistor 151 in inverter 156 will completely be turned off, while N-channel MOS transistor 152 is turned on. No through current flows in inverter 156, since P-channel MOS transistor 151 of the two MOS transistors constituting inverter 156 is completely turned off. Inverter 156 then outputs a voltage of 0V to node N22, turning on, P-channel MOS transistor 157 and turning off N-channel MOS transistor 158 in inverter 159. This prevents the through current from flowing in inverter 159.

Even when common circuit 130 outputs an inactivation signal of level L having a voltage of 0V, no through current will flow in exclusive circuit 140, since either one of P-channel MOS transistors 151, 157 or N-channel MOS transistors 152, 158, which constitute inverters 156 and 159, are completely turned off.

Thus, a problem arises that, when an inactivation signal of level H is used for inactivation, the through current flows only in exclusive circuit 150 connected to external power-supply line 160 where the external power-supply voltage varies to be either 2.5V or 3.3V.

In exclusive circuit 150, it may be possible to generate an inactivation signal having a voltage of 3.3V which is boosted by a voltage converter 210 shown in FIG. 21 in order to prevent the through current, and to output the generated inactivation signal to exclusive circuit 150. Voltage converter 210 includes P-channel MOS transistors 191, 193 and N-channel MOS transistors 192, 194, and an inverter 195. Each of the source terminals of P-channel MOS transistors 191, 193 is connected to a power-supply node 196, while each of the drain terminals of N-channel MOS transistors 192, 194 is connected to a ground terminal 197. Power-supply node 196 is supplied with a voltage of 3.3V. Thus, N-channel MOS transistor 192 is turned on, while N-channel MOS transistor 194 is turned off, by the voltage of 2.5V input from a node N24. A node N25 then comes to have a ground voltage and P-channel MOS transistor 193 is turned on. The voltage of 3.3V is output to a node N26.

When the signal of level H having the voltage of 3.3V generated in node N26 is input to exclusive circuit 150, P-channel MOS transistor 151 of inverter 156 and N-channel MOS transistor 158 of inverter 159 in exclusive circuit 150 are completely turned off, so that no through current flows in exclusive circuit 150.

However, a chip area would disadvantageously be increased if a plurality of voltage converters 210 shown in FIG. 21 are provided in a plurality of portions in the SDRAM.

SUMMARY OF THE INVENTION

It is, therefore, an object of the present invention to provide a semiconductor memory device in which no through current flows in an inactivated circuit, without increasing a chip area.

A semiconductor memory device according to the present invention functions as a first semiconductor memory device operating at a first external power-supply voltage or as a second semiconductor memory device operating at a second external power-supply voltage lower than the first external power-supply voltage. The first semiconductor memory device includes an external power-supply line supplied with the first external power-supply voltage, a voltage down converter connected to the external power-supply line and down-converts the first external power-supply voltage to an internal power-supply voltage, an internal power-supply line connected to the voltage down converter, a switch connected to the internal power-supply line, a first circuit connected to the switch and operated at the internal power-supply voltage, a second circuit connected to the internal power-supply line and operated at the internal power-supply voltage, and a third circuit connected to the external power-supply line and includes, at an input portion thereof, a circuit in which an N-channel MOS transistor or a P-channel MOS transistor is arranged between the external power-supply line and a ground terminal. The first circuit outputs a first functional signal to the second circuit and applies a first inactivation signal fixed to a ground voltage or a second inactivation signal fixed to the first external power-supply voltage to a gate terminal of the N-channel MOS transistor or the P-channel MOS transistor. The second semiconductor memory device includes an external power-supply line supplied with the second external power-supply voltage, a switch connected to the external power-supply line, a first circuit connected to the switch and operated at the second external power-supply voltage, a second circuit connected to the switch, and a third circuit connected to the external power-supply line and operated at the second external power-supply voltage. The first circuit outputs a second functional signal to the third circuit.

The semiconductor memory device according to the present invention is produced to have three types of circuits, that is, the first circuit operated at the internal power-supply voltage which has been down-converted from the first external power-supply voltage and at the second external power-supply voltage, the second circuit operated only at the internal power-supply voltage which has been down-converted from the first external power-supply voltage, and the third circuit operated only at the second external power-supply voltage. The first semiconductor memory device is produced using the first and second circuits. The first and second circuits are operated at the internal power-supply voltage which has been down-converted from the first external power-supply voltage, while the third circuit is supplied with the first external power-supply voltage. The third circuit includes, at the input portion thereof, a circuit in which an N-channel MOS transistor or a P-channel MOS transistor is arranged between the external power-supply line and the ground terminal. The first circuit outputs the first functional signal to the second circuit and applies the first inactivation signal fixed to the ground voltage or the second inactivation signal fixed to the first external power-supply voltage to a gate terminal of the N-channel MOS transistor or the P-channel MOS transistor in the third circuit. The second circuit is then activated, reading and writing data. The third circuit is inactivated, so that the P-channel MOS transistor or the N-channel MOS transistor is surely turned off.

The second semiconductor memory device is produced using the first and third circuits. The first and third circuits are operated at the second external power-supply voltage, and the second circuit is supplied with the second external power-supply voltage. The first circuit outputs the second functional signal to the third circuit. The third circuit is then activated, writing and reading data. Thus, according to the present invention, a circuit unnecessary for the semiconductor memory device can be inactivated, preventing through current from flowing in the inactivated circuit.

Preferably, the third circuit in the first semiconductor memory device includes, at an input portion thereof, an N-channel MOS transistor and a P-channel MOS transistor connected with each other in series between the external power-supply line and the ground terminal. The first circuit in the first semiconductor memory device applies the first inactivation signal or the second inactivation signal to the gate terminals of the N-channel MOS transistor and the P-channel MOS transistor.

The N-channel MOS transistor and the P-channel MOS transistor included in the third circuit of the first semiconductor memory device receive, at the gate terminals thereof, the first inactivation signal fixed to the ground voltage or the second inactivation signal fixed to the first external power-supply voltage from the first circuit, and either one of the transistors is turned off. Thus, according to the present invention, the through current can be prevented from flowing in the third circuit of the first semiconductor memory device.

Preferably, the second circuit in the second semiconductor memory device includes, at an input portion thereof, an N-channel MOS transistor and a P-channel MOS transistor connected with each other in series between the external power-supply line and the ground terminal. The first circuit in the second semiconductor memory device applies the first inactivation signal or a third inactivation signal fixed to the second external power-supply voltage to the gate terminals of the N-channel MOS transistor and the P-channel MOS transistor.

The N-channel MOS transistor and the P-channel MOS transistor included in the second circuit in the second semiconductor memory device receive, at the gate terminals thereof, the first inactivation signal fixed to a ground potential or the third inactivation signal fixed to the second external power-supply voltage from the first circuit, and either one of the transistors is surely turned off. Thus, according to the present invention, through current can be prevented from flowing in the second circuit in the second semiconductor memory device.

Preferably, the first circuit in the first semiconductor memory device applies the first inactivation signal generated based on the internal power-supply voltage to the gate terminals.

When the first semiconductor memory device is produced, the first external power-supply voltage is supplied and the first circuit is operated at the internal power-supply voltage that has been down-converted by the voltage down converter. The first circuit then generates the first inactivation signal fixed to the ground voltage based on the internal power-supply voltage, i.e., an operational power-supply of the circuit, and applies the signal to the gates of the P-channel MOS transistor and the N-channel MOS transistor. Thus, according the present invention, the first inactivation signal can also be generated if the internal power-supply voltage only is supplied.

Preferably, the first circuit includes an inverter generating the first inactivation signal based on the internal power-supply voltage.

In the first circuit, the inverter generates the first inactivation signal fixed to the ground voltage based on the internal power-supply voltage and outputs the signal to the third circuit. Thus, according to the present invention, the first inactivation signal fixed to the ground voltage can readily be generated with a simple configuration.

Preferably, the third circuit in the first semiconductor memory device includes, at an input portion thereof, an inverter to which the first or second inactivation signal is input.

The third circuit includes the inverter at the input portion thereof, and the inverter receives the first or second inactivation signal from the first circuit. The inverter is provided between an external power-supply line and a ground terminal, the external power-supply line being supplied with the first external power-supply voltage. As the inverter receives the first inactivation signal from the first circuit, the N-channel MOS transistor included in the inverter is turned off. Further, when the inverter receives the second inactivation signal from the first circuit, the P-channel MOS transistor also included in the inverter is turned off. Thus, according to the present invention, a circuit to be inactivated can be inactivated merely by providing the inverter at the input portion thereof, and through current therein can be prevented.

Preferably, the third circuit in the first semiconductor memory device includes a pulse generating circuit, including a plurality of inverters connected with each other in series, to which the first or the second inactivation signal is input, and also including an NOR gate to which the first or second inactivation signal and output signals of the plurality of inverters are input.

The third circuit includes a pulse generating circuit including a plurality of inverters and an NOR gate. The first or second inactivation signal is input to the plurality of inverters and the NOR gate, and the through current can be prevented from flowing in the plurality of inverters and in the NOR gate.

Preferably, the plurality of inverters constituting the pulse generating circuit include odd number of inverters, the odd number of inverters and the NOR gate receiving the first inactivation signal.

When the pulse generating circuit is constituted of the odd number of inverters and the NOR gate, the odd number of inverters and the NOR gate receive the first inactivation signal. The inverters and the NOR gate output a signal fixed to level H or L to inactivate the third circuit, and N-channel MOS transistors included in the inverters and the NOR gate are turned off. Thus, according to the present invention, through current can be prevented from flowing in the third circuit, as the pulse generating circuit generating a pulse is provided at the input portion thereof.

Preferably, the first circuit in the first semiconductor memory device includes an inactivation circuit outputting the first inactivation signal, and a common signal circuit outputting a common signal to the second and third circuits. The third circuit includes, at an input portion thereof, an NAND gate or an NOR gate.

The first circuit outputs the common signal to the second circuit, and outputs the common signal and the first inactivation signal to the third circuit. The second circuit is operated by the common signal that has been input. The third circuit includes the NAND gate or the NOR gate at the input portion thereof. An N-channel MOS transistor included in the NAND gate or the NOR gate is turned off by the first inactivation signal, independent of the level (H or L) of the common signal. Thus, according to the present invention, even when the second and third circuits receive the common signal, the third circuit unnecessary for production of the first semiconductor memory device can be inactivated, and through current can be prevented from flowing in the third circuit.

Preferably, when the first semiconductor memory device is produced, the inactivation circuit constituting the first circuit includes an inverter generating the first inactivation signal based on the internal power-supply voltage, and a third switch connected to the inverter.

When the first semiconductor memory device is produced, the third switch in the inactivation circuit is connected to the inverter. The inverter then outputs the first inactivation signal generated based on the internal power-supply voltage to the third circuit via the third switch. Further, the common signal circuit outputs the common signal to the second and third circuits. Thus, according to the present invention, the third circuit to which the common signal is input can be inactivated by the simple configuration, such as the one formed by merely generating the first inactivation signal by the inverter, and the through current in the third circuit can be prevented.

Preferably, a plurality of the second and third circuits are provided in the first semiconductor memory device, and the common signal circuit outputs two common signals to each of the plurality of second and third circuits.

In the first semiconductor memory device, a plurality of the second circuit to be activated and a plurality of the third circuit to be, inactivated are provided, and two common signals are input to the plurality of the second and third circuits. The first inactivation signal is input to the plurality of the third circuits. That is, the plurality of third circuits are inactivated by the first inactivation signal when the plurality of second circuits receive the two common signal and are operated. Thus, according to the present invention, in the semiconductor memory device in which the second circuit is operated by the two common signals, the third circuit is also inactivated, and the through current can be prevented.

Preferably, the common signal circuit outputs a read data signal. The first circuit outputs the read data signal to the second circuit, in which an input/output circuit outputs the read data signal to an input/output terminal. Thus, according to the present invention, the third circuit can be inactivated while data is actually being read, and the through current in the third circuit can be prevented.

Preferably, the switch is provided by an interconnection mask in a step of master slicing.

When the first or second semiconductor memory device is produced, the switch is connected to either one of the interconnections by the interconnection formed by the metal mask in the manufacturing process of the device. Thus, according to the present invention, it is possible to selectively produce one of two types of semiconductor memory devices in the manufacturing process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
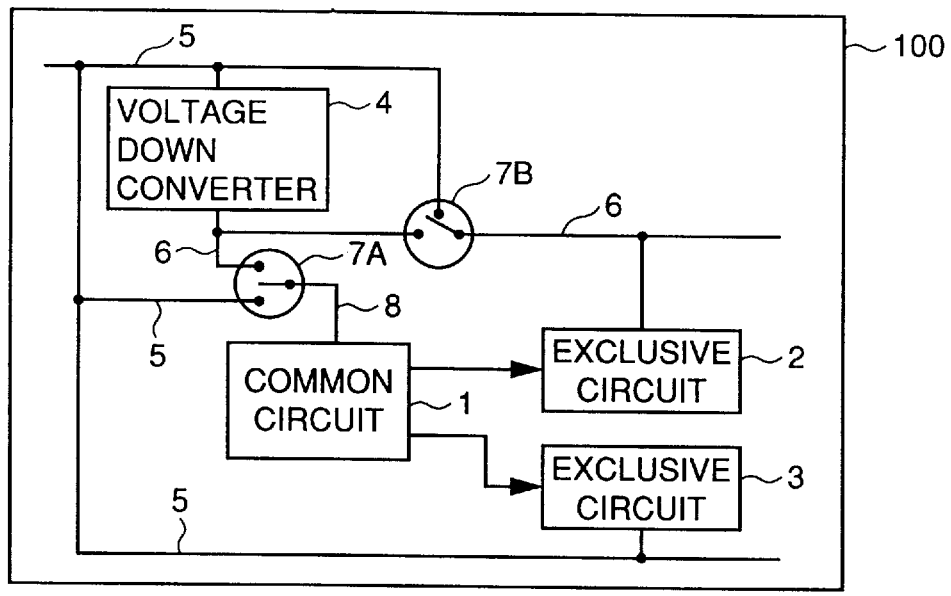
FIG. 1 is a schematic block diagram of a semiconductor memory device according to the first embodiment.

Embodiments of the present invention will be described in detail with reference to the attached drawings. Same or corresponding parts are denoted by the same reference characters and the descriptions thereof will not be repeated.

First Embodiment

Referring to FIG. 1, semiconductor memory device 100 according to the present invention includes a common circuit 1, exclusive circuits 2 and 3, a voltage down converter 4, an external power-supply line 5, an internal power-supply line 6, switches 7A and 7B, and a power-supply line 8.

Common circuit 1 is operated when external power-supply line 5 is supplied with an external power-supply voltage of 3.3V or an external power-supply voltage of 2.5V. Exclusive circuit 2 is operated only when external power-supply line 5 is supplied with the external power-supply voltage of 3.3V. Exclusive circuit 3 is operated only when external power-supply line 5 is supplied with the external power-supply voltage of 2.5V.

Thus, common circuit 1 is a circuit common to both an SDR-SDRAM and a DDR-SDRAM, and is, for example, a row/column address buffer circuit or a row/column address decoder. Common circuit 1 is connected to power-supply line 8, and is supplied with the external power-supply voltage of 2.5V supplied to external power-supply line 5 or with an internal power-supply voltage of 2.5V supplied to internal power-supply line 6 via switch 7A. Exclusive circuit 2 is a circuit exclusive to the SDR-SDRAM, and is, for example, an SDR clock buffer or an input/output circuit for SDR. Exclusive circuit 2 is connected to internal power-supply line 6 and is supplied with the internal power-supply voltage of 2.5V or with the external power-supply voltage of 2.5V via switch 7B. Exclusive circuit 3 is a circuit exclusive to the DDR-SDRAM, and is, for example, a DDR clock buffer or an input/output circuit for DDR. Exclusive circuit 3 is connected to external power-supply line 5 and is supplied with the external power-supply voltage of 2.5V or 3.3V.

Voltage down converter 4 is connected to external power-supply line 5 and down-converts the external power-supply voltage of 3.3V supplied to external power-supply line 5 to the internal power-supply voltage of 2.5V. External power-supply line 5 supplies the external power-supply voltage of 2.5V or 3.3V, supplied from an input/output terminal (not shown) for the external power-supply voltage, to exclusive circuit 3, voltage down converter 4, and switches 7A and 7B. Internal power-supply line 6 supplies, to switch 7A, the internal power-supply voltage of 2.5V which has been down-converted by voltage down converter 4, and supplies the internal power-supply voltage of 2.5V to exclusive circuit 2 via switch 7B. When external power-supply line 5 is supplied with the external power-supply voltage of 2.5V, internal power-supply line 6 supplies the external power-supply voltage to exclusive circuit 2. Switches 7A and 7B are connected to external power-supply line 5 or internal power-supply line 6 by a metal mask in a manufacturing process of the SDR-SDRAM or the DDR-SDRAM. Switches 7A and 7B are connected to internal power-supply line 6 when external power-supply line 5 is supplied with the external power-supply voltage of 3.3V, and are connected to external power-supply line 5 when external power-supply line 5 is supplied with the external power-supply voltage of 2.5V.

Semiconductor memory device 100 enables selective production of the SDR-SDRAM or DDR-SDRAM. When the SDR-SDRAM is produced, common circuit 1 and exclusive circuit 2 are utilized, and when the DDR-SDRAM is produced, common circuit 1 and exclusive circuit 3 are utilized. Thus, when the SDR-SDRAM is produced, common circuit 1 outputs, to exclusive circuit 2, a signal for writing and reading data to/from a memory cell, and outputs, to exclusive circuit 3, an inactivation signal for inactivating exclusive circuit 3. On the other hand, when the DDR-SDRAM is produced, common circuit 1 outputs, to exclusive circuit 3, a signal, for writing and reading data to/from a memory cell, and outputs, to exclusive circuit 2, an inactivation signal for inactivating exclusive circuit 2.

When semiconductor memory device 100 is used as the SDR-SDRAM, external power-supply line 5 is supplied with the external power-supply voltage of 3.3V. Switches 7A and 7B are connected to internal power-supply line 6 by the metal mask. Voltage down converter 4 then down-converts the external power-supply voltage of 3.3V, supplied by external power-supply line 5, to the internal power-supply voltage of 2.5V, and supplies the internal power-supply voltage to switches 7A and 7B via internal power-supply line 6. Switches 7A and 7B are connected to internal power-supply line 6, so that common circuit 1 is supplied with the internal power-supply voltage of 2.5V by power-supply line 8, and exclusive circuit 2 is supplied with the internal power-supply voltage of 2.5V by internal power-supply line 6. Further, exclusive circuit 3 is supplied with the external power-supply voltage of 3.3V by external power-supply line 5. Though exclusive circuit 3 is operated only at the external power-supply voltage of 2.5V, the external power-supply voltage of 3.3V, i.e., a higher voltage than the driving voltage of the circuit, is supplied thereto when the SDR-SDRAM is produced.

When semiconductor memory device 100 is used as a DDR-SDRAM, external power-supply line 5 is supplied with the external power-supply voltage of 2.5V. Switches 7A and 7B are connected to external power-supply line 5 by a metal mask. Common circuit 1 is then supplied with the external power-supply voltage of 2.5V by power-supply line 8, and exclusive circuit 2 is supplied with the external power-supply voltage of 2.5V by the internal power-supply line 6. Further, exclusive circuit 3 is supplied with the external power-supply voltage of 2.5V by external power-supply line 5.

Figure 2:
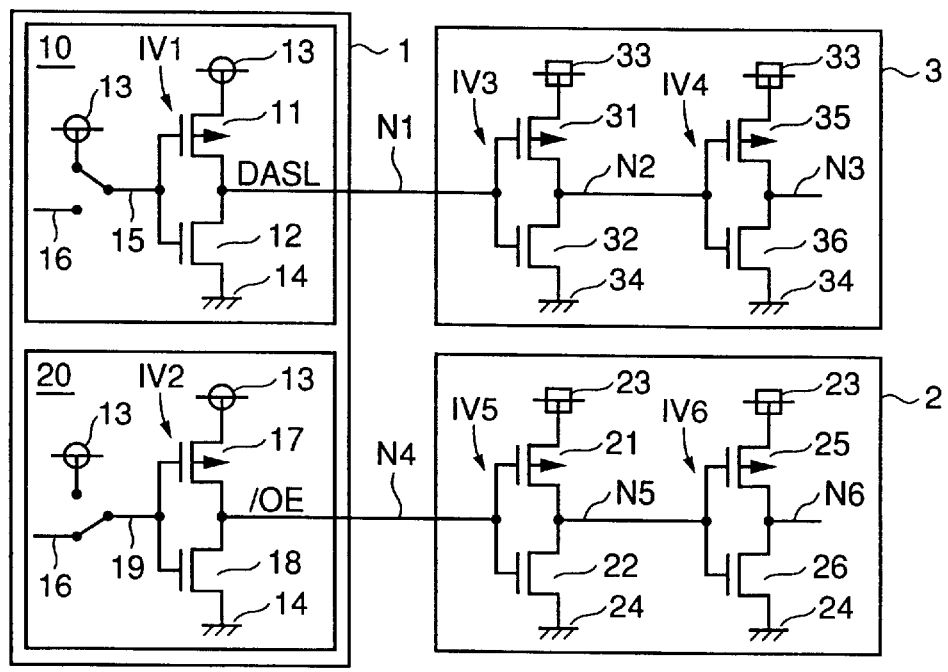
FIG. 2 is a circuit diagram of a common circuit and an exclusive circuit included in the semiconductor memory device in FIG. 1.

Referring to FIGS. 2–5, inactivation of exclusive circuits 2 and 3 will be described. Referring to FIG. 2, common circuit 1 includes inactivation/activation circuits 10 and 20. Inactivation/activation circuit 10 includes an inverter IV1, a power-supply node 13, a ground terminal 14, and nodes 15 and 16. Inverter IV1 includes a P-channel MOS transistor 11 and an N-channel MOS transistor 12, and is provided between power-supply node 13 and ground terminal 14. Inactivation/activation circuit 20 includes an inverter IV2, a power-supply node 13, a ground terminal 14 and nodes 16 and 19. Inverter IV2 includes a P-channel MOS transistor 17 and an N-channel MOS transistor 18, and is provided between power-supply node 13 and ground terminal 14. Node 16 supplies a signal, with which exclusive circuits 2 and 3 function as circuits that are writing and reading data to/from semiconductor memory device 100, such as an output enable signal or the like, to inverters IV1 and IV2.

Power-supply node 13 of inactivation/activation circuits 10 and 20 are supplied with the internal power-supply voltage of 2.5V or the external power-supply voltage of 2.5V. Thus, inverter IV1 outputs an inactivation signal DASL fixed to a ground voltage to a node N1 when node 15 is connected to power-supply node 13, and outputs a signal inverted from an output enable signal OE or the like to node N1 when node 15 is connected to node 16. Further, inactivation/activation circuit 20 outputs an inactivation signal DASL fixed to the ground voltage to a node N4 when node 19 is connected to power-supply node 13, while it outputs a signal inverted from the output enable signal OE or the like to node N4 when node 19 is connected to node 16.

Exclusive circuit 2 includes inverters IV5 and IV6 at an input portion thereof. Inverter IV5 includes a P-channel MOS transistor 21 and an N-channel MOS transistor 22, and is provided between a power-supply node 23 and a ground terminal 24. Inverter IV6 includes a P-channel MOS transistor 25 and an N-channel MOS transistor 26, and is provided between power-supply node 23 and ground terminal 24. Inverter IV5 and inverter IV6 are connected by a node N5.

Exclusive circuit 3 includes inverters IV3 and IV4 at an input portion thereof. Inverter IV3 includes a P-channel MOS transistor 31 and an N-channel MOS transistor 32, and is provided between a power-supply node 33 and a ground terminal 34. Inverter IV4 includes a P-channel MOS transistor 35 and an N-channel MOS transistor 36, and is provided between power-supply node 33 and ground terminal 34. Inverter IV3 and inverter IV4 are connected by a node N2.

When semiconductor memory device 100 is produced as an SDR-SDRAM, node 15 is connected to power-supply node 13, so that inactivation/activation circuit 10 outputs an inactivation signal DASL fixed to the ground voltage to node N1. Further, node 19 is connected to node 16, so that inactivation/activation circuit 20 outputs a signal /OE inverted from output enable signal OE. Further, power-supply node 23 of exclusive circuit 2 is supplied with the internal power-supply voltage of 2.5V, and power-supply node 33 of exclusive circuit 3 is supplied with the external power-supply voltage of 3.3V. Inactivation signal DASL is then input to exclusive circuit 3 from node N1, and a voltage of 0V is applied to the respective gate terminals of P-channel MOS transistor 31 and N-channel MOS transistor 32 in inverter IV3. Thus, P-channel MOS transistor 31 is turned on and N-channel MOS transistor 32 is turned off. Therefore, no through current flows from power-supply node 33 to ground terminal 34 in inverter IV3. Inverter IV3 then outputs a signal of level H (logical high), having a voltage of 3.3V, to node N2.

The signal of level H on node N2 is input to inverter IV4, and a voltage of 3.3V is applied to the respective gate terminals of P-channel MOS transistor 35 and N-channel MOS transistor 36. P-channel MOS transistor 35 is then completely turned off while N-channel MOS transistor 36 is turned on. The gate terminal of P-channel MOS transistor 35 is supplied with a voltage of 3.3V, i.e., the same voltage supplied to the source terminal thereof, so that P-channel MOS transistor 35 is completely turned off. Thus, no through current flows from power-supply node 33 to ground terminal 34 in inverter IV4. Inverter IV4 outputs a signal of level L (logical low), having a voltage value of 0V, to node N3.

Therefore, inverters IV3 and IV4 output constant signals of levels H and L respectively, so that exclusive circuit 3 is inactivated, not functioning as a circuit for a semiconductor memory device. Generation of through current in exclusive circuit 3 is prevented, since no through current flows in inverters IV3 and IV4.

Inactivation/activation circuit 20 outputs a signal /OE, inverted from output enable signal OE, to node N4, since node 19 is connected to node 16. Signal /OE is input to exclusive circuit 2 from node N4, and inverters IV5 and IV6 output signals based on signal /OE to nodes N5 and N6, respectively. This allows exclusive circuit 2 to be activated and to function as a circuit for a semiconductor memory device.

Figure 3:
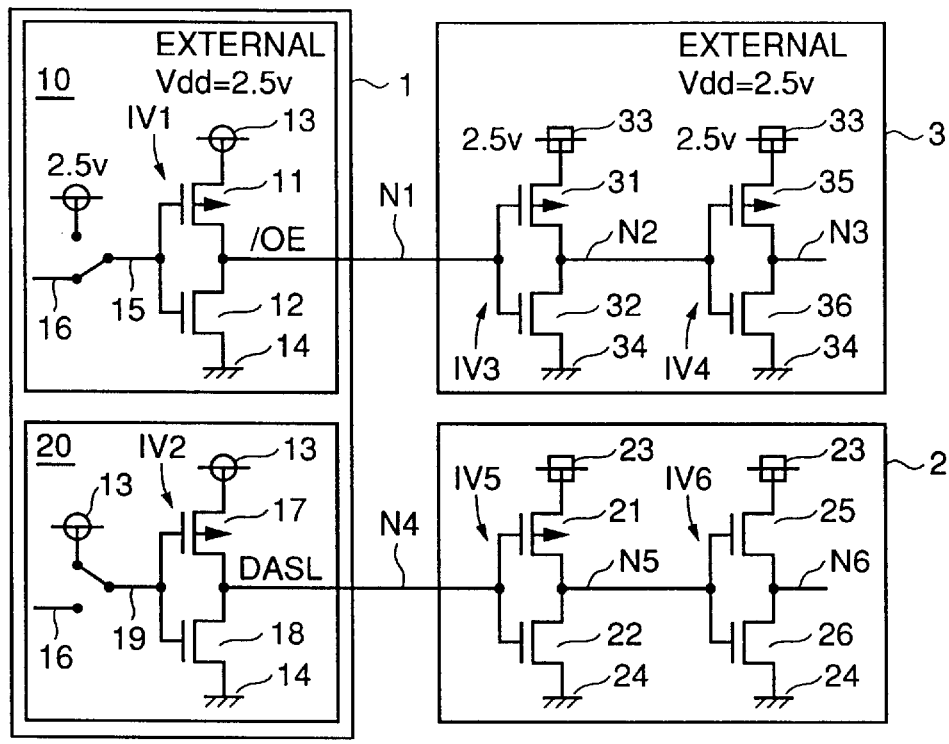
FIG. 3 is a circuit diagram of the common circuit and the exclusive circuit included in the semiconductor memory device in FIG. 1.

Referring to FIG. 3, when semiconductor memory device 100 is produced as the DDR-SDRAM, the external power-supply voltage of 2.5V is supplied to power-supply node 13 of inactivation/activation circuits 10, 20, and power-supply node 33 of exclusive circuits 2 and 3. Node 15 of inactivation/activation circuit 10 is connected to node 16, and node 19 of inactivation/activation circuit 20 is connected to power-supply node 13. Inactivation/activation circuit 10 outputs signal /OE inverted from output enable signal OE to node N1. Inactivation/activation circuit 20 outputs inactivation signal DASL to node N4. As a result, N-channel MOS transistor 22 is turned off while P-channel MOS transistor 25 is completely turned off in exclusive circuit 2, which is inactivated while exclusive circuit 3 is activated. In this case, generation of the through current in exclusive circuit 2 is prevented.

Figure 4:
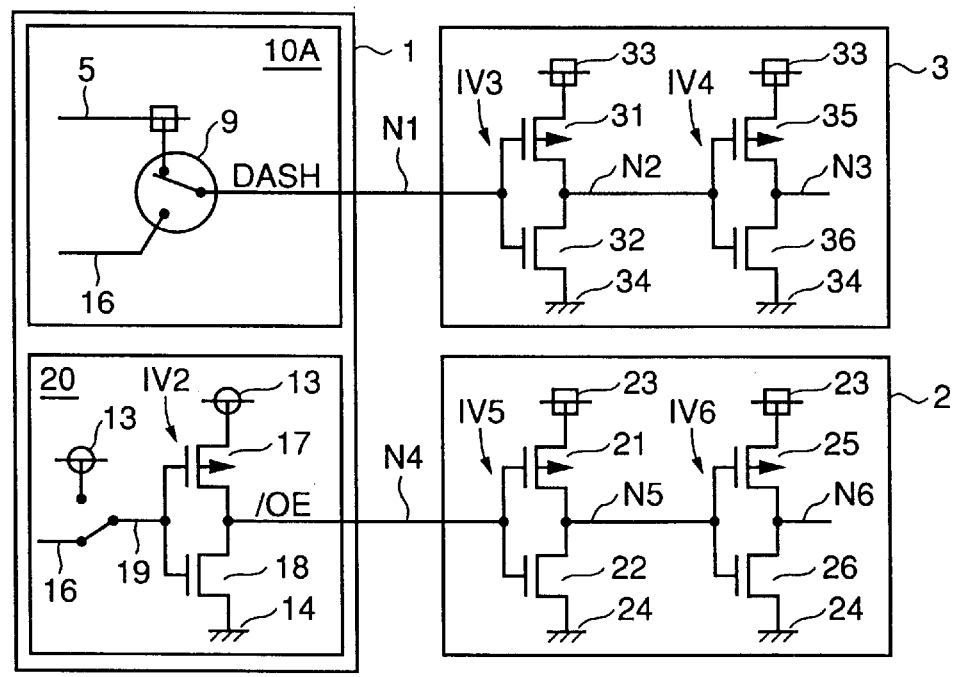
FIG. 4 is a circuit diagram of another common circuit and the exclusive circuit included in the semiconductor memory device in FIG. 1.

Referring to FIG. 4, common circuit 1 includes an inactivation/activation circuit 10A and an inactivation/activation circuit 20. Inactivation/activation circuit 10A includes an external power-supply line 5, a switch 9 and a node 16. Switch 9 is connected to external power-supply line 5 or to node 16. Switch 9 outputs an inactivation signal DASH having a voltage value of 3.3V to node N1 when connected to external power-supply line 5, and outputs the output enable signal OE when connected to node 16, as described above.

When semiconductor memory device 100 is produced as an SDR-SDRAM, switch 9 is connected to external power-supply line 5, so that inactivation/activation circuit 10A outputs inactivation signal DASH to node N1. When semiconductor memory device 100 is produced as the SDR-SDRAM, external power-supply line 5 is supplied with the external power-supply voltage of 3.3V, thus inactivation signal DASH being a signal of level H having a voltage of 3.3V. Inactivation/activation circuit 20 outputs, to node N4, signal /OE inverted from output enable signal OE.

In exclusive circuit 3, inactivation signal DASH is input from node N1, a voltage of 3.3V is applied to the respective gate terminals of P-channel MOS transistor 31 and N-channel MOS transistor 32 in inverter IV3. P-channel MOS transistor 31 is then turned off while N-channel MOS transistor 32 is turned on. The gate terminal of P-channel MOS transistor 31 is supplied with a voltage of 3.3V, i.e., the same voltage as the one supplied to the source terminal thereof, so that P-channel MOS transistor 31 is completely turned off. Therefore, no through current flows from power-supply node 33 to ground terminal 34 in inverter IV3. Inverter IV3 then outputs to node N2, a signal of level L having a voltage value of 0V.

A signal of level L on node 2 is input to inverter IV4, and a voltage of 0V is applied to the respective gate terminals of P-channel MOS transistor 35 and N-channel MOS transistor 36. P-channel MOS transistor 35 is then turned on while N-channel MOS transistor 36 is turned off. Therefore, no through current flows from power-supply node 33 to ground terminal 34 in inverter IV4. Inverter IV4 outputs a signal of level H, having a voltage value of 3.3V, to node N3.

Thus, inverters IV3 and IV4 output constant signals of levels H and L respectively, so that exclusive circuit 3 is inactivated, not functioning as a circuit for a semiconductor memory device. Therefore, no through current flows in inverters IV3 and IV4, so that generation of the through current in exclusive circuit 3 is prevented.

Inactivation/activation circuit 20 outputs, to node N4, a signal /OE inverted from the output enable signal OE, since node 19 is connected to node 16. Signal /OE is input to exclusive circuit 2 from node N4, and inverters IV5 and IV6 respectively output the signals based on the signal /OE to nodes N5 and N6. This allows exclusive circuit 2 to be activated and to function as a circuit for a semiconductor memory device.

Figure 5:
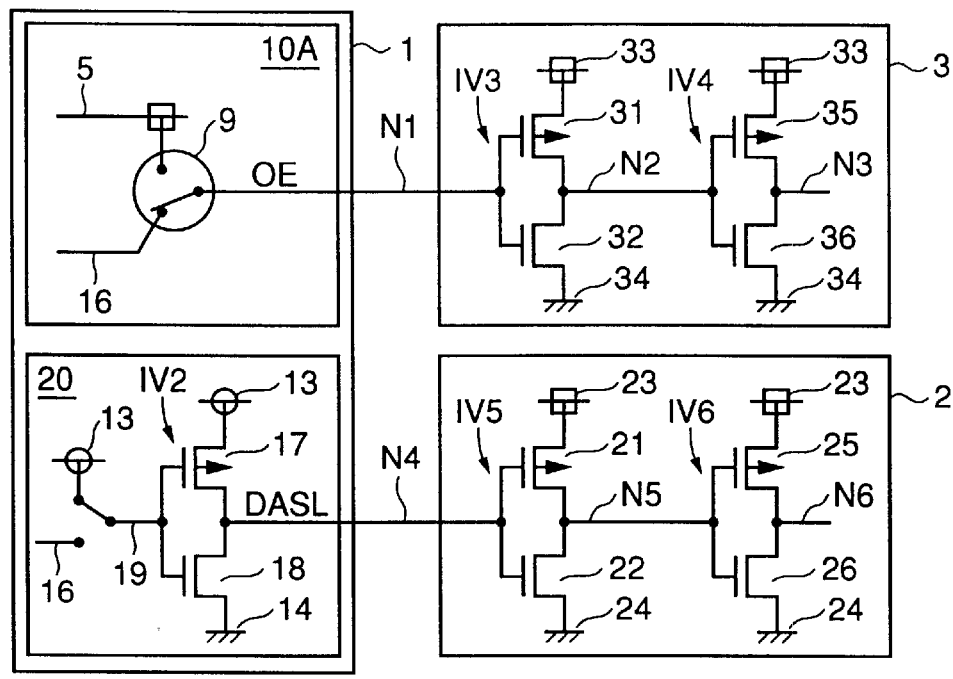
FIG. 5 is a circuit diagram of another common circuit and the exclusive circuit included in the semiconductor memory device in FIG. 1.

Referring to FIG. 5, when semiconductor memory device 100 is produced as the DDR-SDRAM, switch 9 of inactivation/activation circuit 10A is connected to node 16, and node 19 of inactivation/activation circuit 20 is connected to power-supply node 13. Power-supply node 13 of inactivation/activation circuit 20 and power-supply node 33 of each of exclusive circuits 2 and 3 are supplied with the external power-supply voltage of 2.5V. Inactivation/activation circuit 10A then outputs the output enable signal OE to node N1. Inactivation/activation circuit 20 outputs inactivation signal DASL to node N4. As a result, exclusive circuit 2 is inactivated while exclusive circuit 3 is activated, as in the case described above. In this case, generation of the through current in exclusive circuit 2 is prevented.

It is noted that, though it has been described that the circuit to be inactivated includes, at the input portion thereof, a P-channel MOS transistor and an N-channel MOS transistor connected in series between an external power-supply line and a ground terminal, the present invention is not limited thereto, and a high resistance may be used in place of the P-channel MOS transistor when an inactivation signal fixed to a ground potential is input, or a high resistance may be used in place of the N-channel MOS transistor when an inactivation signal fixed to the external power-supply voltage of 3.3V is input. Generally, the circuit to be inactivated may be of any type as long as it includes, at an input portion thereof, a circuit in which an N-channel MOS transistor and a P-channel MOS transistor are arranged between an external power-supply line and a ground terminal. The input of the inactivation signal prevents generation of the through current. The high resistance means that a connection point between the N-channel MOS transistor or the P-channel MOS transistor and the resistance, that are serially connected with each other, can hold an external power-supply voltage or a ground voltage.

Further, internal power-supply line 6 may be directly connected to power-supply line 8 without switch 7B shown in FIG. 1. In such a case, switch 7A is connected to external power-supply line 5 or internal power-supply line 6, so that exclusive circuit 2 is supplied with the external power-supply voltage or the internal power-supply voltage, and so forth.

According to the first embodiment, in semiconductor memory device 100, exclusive circuit 2 includes inverters IV3 and IV4 in which P-channel MOS transistors 21, 25 and N-channel MOS transistors 22, 26 are connected with each other in series between power-supply node 23 supplied with the external power-supply voltage by external power-supply line 5 and ground terminal 24. Exclusive circuit 3 includes inverters IV5 and IV6 in which P-channel MOS transistors 31, 35 and N-channel MOS transistors 32, 36 are connected with each other in series between power-supply node 33 supplied with the external power-supply voltage by external power-supply line 5 and ground terminal 34. Common circuit 1 outputs, to exclusive circuits 2 and 3, inactivation signal DASL fixed to the ground voltage (0V) or inactivation signal DASH fixed to the external power-supply voltage of 3.3V. Therefore, an exclusive circuit unnecessary for forming a semiconductor memory device can be inactivated, preventing the through current from flowing in the inactivated exclusive circuit.

Second Embodiment

Figure 6:
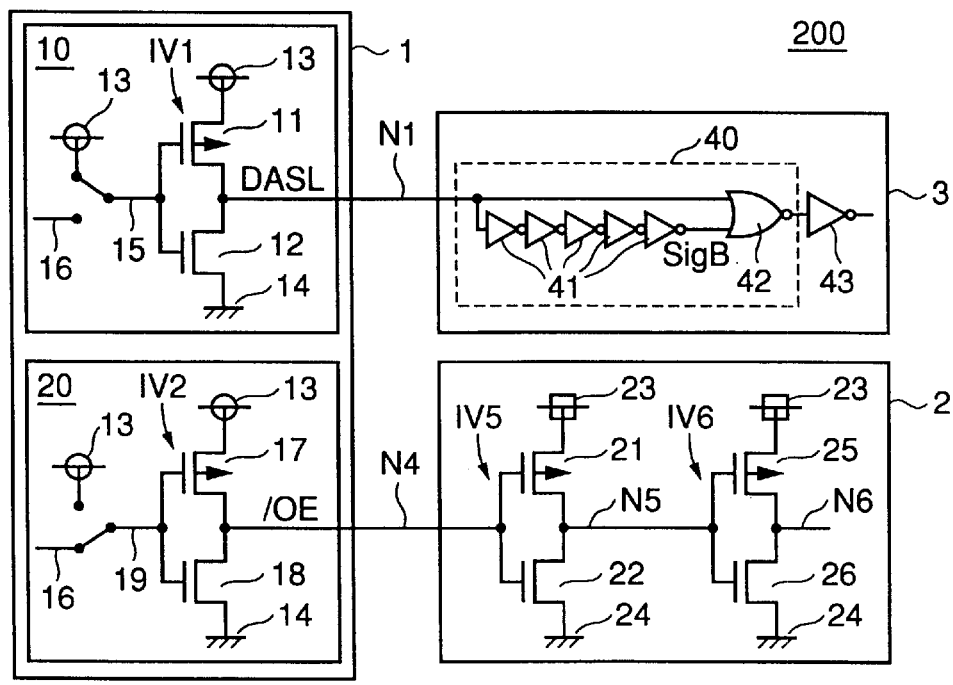
FIG. 6 is a circuit diagram of a common circuit and an exclusive circuit included in a semiconductor memory device according to the second embodiment.

Referring to FIG. 6, a semiconductor memory device 200 according to the second embodiment has the same configuration as that of semiconductor memory device 100, except that exclusive circuit 3 includes, at the input portion thereof, a pulse generating circuit 40.

Figure 7:
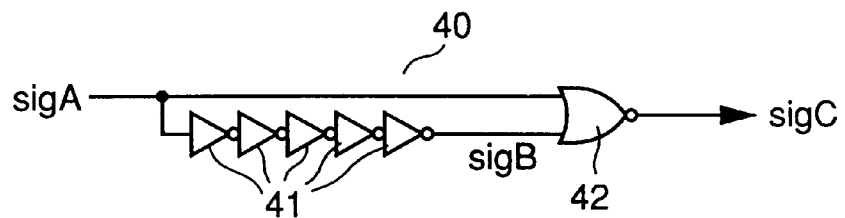
FIG. 7 is a circuit diagram of a pulse generating circuit.

Referring to FIG. 7, pulse generating circuit 40 includes five inverters 41 and an NOR gate 42. Five inverters 41 output a signal SigB inverted from an input signal SigA. Input signal SigA and signal SigB are input to NOR gate 42, which outputs a signal SigC.

Figure 8:
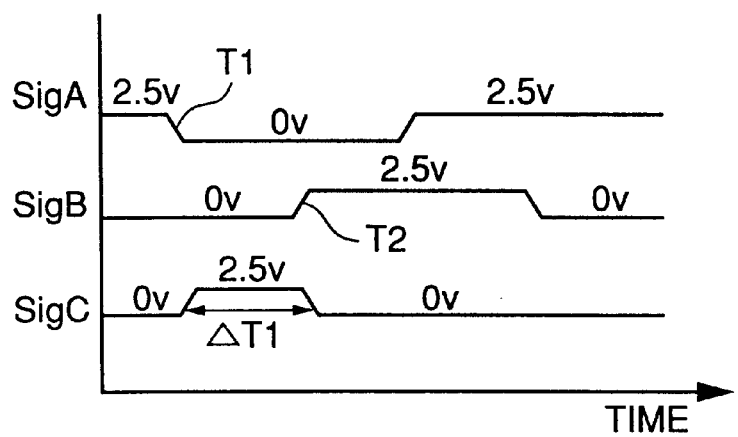
FIG. 8 is a timing chart indicating a signal in the pulse generating circuit shown in FIG. 7.

Referring to FIG. 8, when signal SigA, switched from levels H to L for a certain period, is input, five inverters 41 output signal SigB switched from levels L to H at timing T2, which is delayed only for a certain period $\Delta T1$ from timing T1 in which signal SigA is switched from levels H to L.

NOR gate 42 then outputs signal SigC of level H, only for the period ΔT1 during which signals SigA and SigB are both at level L, based on signals SigA and SigB. Thus, pulse generating circuit 40 outputs a pulse signal of level H, only for the certain period ΔT1, based on a signal of which level is periodically switched from H to L. Signal SigA is held at level H at a standby, while signals SigB and SigC are held at level L at a standby.

It is noted that the number of the inverters included in pulse generating circuit 40 may not be limited to five, but may generally be any odd number.

Referring again to FIG. 6, when semiconductor memory device 200 is produced as the SDR-SDRAM, inactivation/activation circuit 10 outputs inactivation signal DASL to exclusive circuit 3, and inactivation/activation circuit 20 outputs a signal /OE inverted from output enable signal OE.

Inactivation signal DASL is input to pulse generating circuit 40 in exclusive circuit 3, and five inverters 41 output a signal of level H having a voltage value of 3.3V to one terminal of NOR gate 42, which then outputs a signal of level L having a voltage value of 0V. NOR gate 42 has an arrangement in which two P-channel MOS transistors connected with each other in series and two N-channel MOS transistors connected with each other in parallel are connected in series between power-supply node 33 and ground terminal 34, so that no through current flows when a signal of level H having a voltage value of 3.3V is input to one terminal. As a result, when inactivation signal DASL fixed to 0V is input to pulse generating circuit 40, generation of through current is prevented in inverter 41, 43 and NOR gate 42.

In such a case, power-supply node 33 to which inverter 41 is connected is supplied with the external power-supply voltage of 3.3V, so that generation of through current in inverter 41 cannot be prevented, even if a signal of level H having a voltage value of 2.5V is input from common circuit 1. Thus, inactivation signal DASL having a voltage value of 0V is used to prevent generation of the through current in inverters 41 and 43, and a signal of level H, having a voltage value of 3.3V, output by inverter 41 is used to prevent generation of the through current in NOR gate 42.

Therefore, when inactivation signal DASL is input to exclusive circuit 3 which includes pulse generating circuit 40 at the input portion thereof, exclusive circuit 3 is inactivated and generation of the through current can be prevented.

When inactivation/activation circuit 20 outputs signal /OE inverted from output enable signal OE to node N4, exclusive circuit 2 is activated as described earlier.

Figure 9:
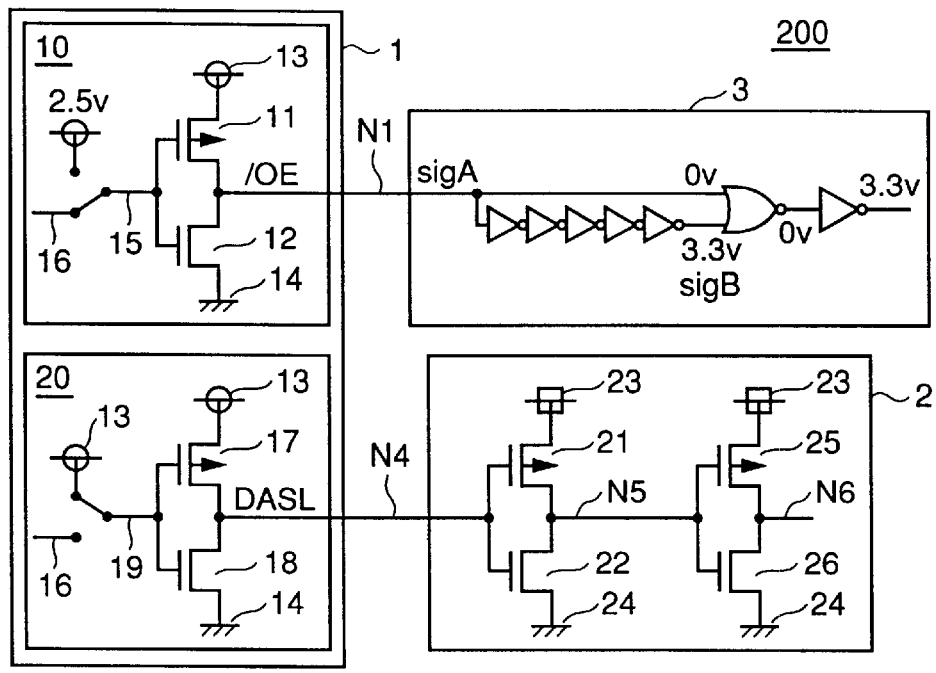
FIG. 9 is a circuit diagram of a common circuit and an exclusive circuit included in the semiconductor memory device according to the second embodiment.

Referring to FIG. 9, when semiconductor memory device 200 is produced as the DDR-SDRAM, inactivation/activation circuit 10 outputs signal /OE to node N1, while inactivation/activation circuit 20 outputs inactivation signal DASL to node N4. Pulse generating circuit 40 then outputs a signal based on signal /OE, activating exclusive circuit 3. Exclusive circuit 2 is inactivated as described earlier, and no through current will flow therein.

Figure 10:
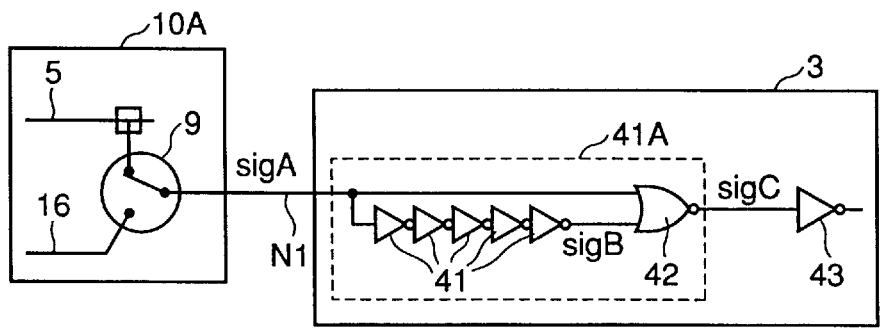
FIG. 10 is a circuit diagram of an another common circuit and the exclusive circuit included in the semiconductor memory device according to the second embodiment.

Referring to FIG. 10, common circuit 1 includes an inactivation/activation circuit 10A. When semiconductor memory device 200 is produced as the SDR-SDRAM, switch 9 is connected to external power-supply line 5, so that inactivation/activation circuit 10A outputs, to exclusive circuit 3, inactivation signal DASH fixed to the external power-supply voltage of 3.3V. Pulse generating circuit 40 then outputs a constant signal of level L while inverter 43 outputs a constant signal of level H. Thus, exclusive circuit 3 is inactivated as described above, and generation of through current is prevented. In this case, inactivation/activation circuit 20 outputs signal /OE to node N4. Therefore, exclusive circuit 2 is activated as described above.

When semiconductor 200 is produced as the DDR-SDRAM, inactivation/activation circuit 10A outputs signal /OE to node N4. Pulse generating circuit 40 then outputs a signal based on signal /OE, activating exclusive circuit 3. In this case, inactivation/activation circuit 20 outputs inactivation signal DASL to node N4. Thus, exclusive circuit 2 is inactivated as described above, and generation of the through current is prevented.

According to the second embodiment, in semiconductor memory device 200, exclusive circuit 2 includes an inverter in which a P-channel MOS transistor and an N-channel transistor are connected with each other in series between power-supply node 23 supplied with the external power-supply voltage by external power-supply line 5 and ground terminal 24, or includes an NOR gate having an arrangement in which a P-channel MOS transistor and an N-channel MOS transistor are serially connected with each other. Exclusive circuit 3 includes an inverter in which a P-channel MOS transistor and an N-channel MOS transistor are connected with each other in series between power-supply node 33 supplied with the external power-supply voltage by external power-supply line 5 and ground terminal 34, or includes an NOR gate in which a P-channel MOS transistor and an N-channel MOS transistor are serially connected with each other. Common circuit 1 outputs to exclusive circuits 2 and 3, inactivation signal DASL fixed to the ground voltage (0V) or inactivation signal DASH fixed to the external power-supply voltage of 3.3V. Therefore, an exclusive circuit unnecessary for forming the semiconductor memory device can be inactivated, and thus through current in the inactivated exclusive circuit can be prevented.

Third Embodiment

Figure 11:
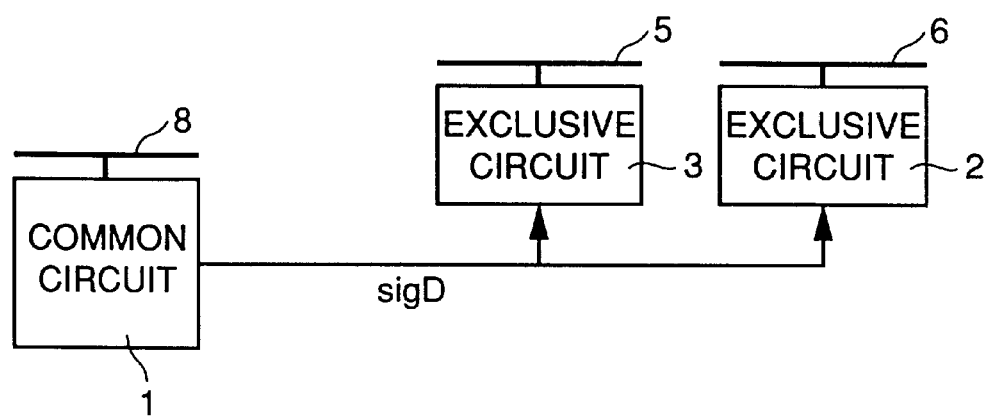
FIG. 11 is a block diagram illustrating a problem caused when a common signal is input into two exclusive circuits.

Referring to FIG. 11, when common circuit 1 outputs a common signal SigD to exclusive circuits 2 and 3, it is not possible to inactivate either one of exclusive circuits 2 and 3 by common signal SigD. In such a case, if common circuit 1 outputs one of two common signals SigD to exclusive circuit 2 and the other common signal SigD to exclusive circuit 3, either one of exclusive circuits 2 and 3 can be inactivated, as in the case of the first embodiment.

However, the number of interconnections is increased by such a method, causing a problem of the increase of a chip area.

Figure 12:
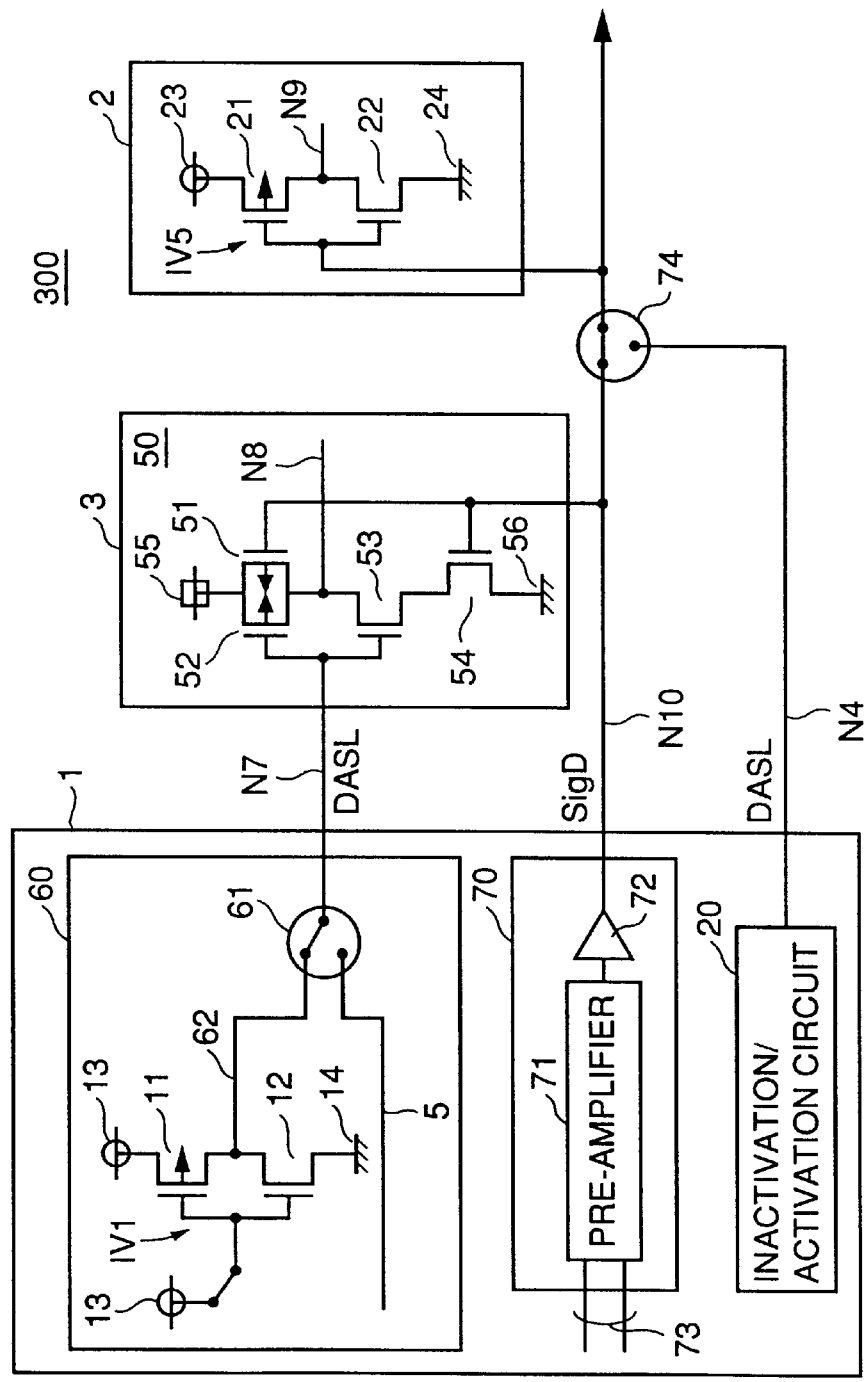
FIG. 12 is a circuit diagram of a common circuit and an exclusive circuit included in a semiconductor memory device according to the third embodiment.

The third embodiment is, therefore, directed to solve such a problem. Referring to FIG. 12, semiconductor memory device 300 according to the third embodiment includes common circuit 1, exclusive circuits 2, 3 and a switch 74. Common circuit 1 includes inactivation/activation circuits 20 and 60, and a common signal circuit 70. Exclusive circuit 3 includes an NAND gate 50 at the input portion thereof The rest of the configuration is the same as that of semiconductor memory device 100.

NAND gate 50 includes a P-channel MOS transistors 51, 52 and N-channel MOS transistors 53, 54. Common signal circuit 70 applies common signal SigD to the gate terminals of P-channel MOS transistor 51 and N-channel MOS transistor 54. Inactivation/activation circuit 60 applies a signal to the gate terminals of P-channel MOS transistor 52 and N-channel MOS transistor 53.

Inactivation/activation circuit 60 includes an inverter IV1, an external power-supply line 5, a switch 61 and a node 62.

Switch 61 is connected to external power-supply line 5 or to node 62. Switch 74 is connected to node N4 or to N10.

Figure 13:
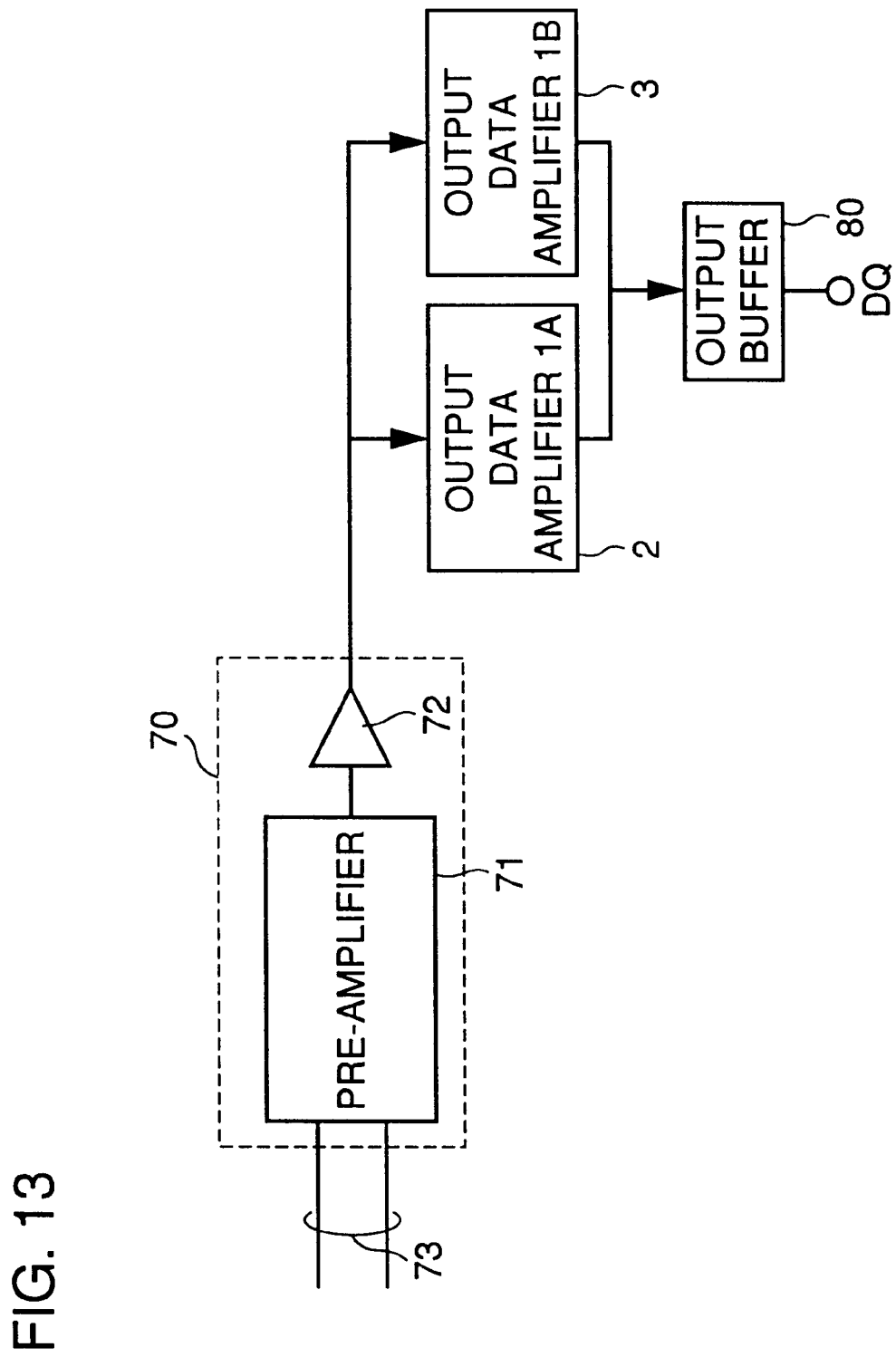
FIG. 13 is a schematic block diagram illustrating a configuration of a common circuit generating a common signal.

Common signal circuit 70 includes a pre-amplifier 71 and a buffer 72. Referring to FIG. 13, a read data signal which is read from a memory cell (not shown) is input from an internal I/O line 73 to pre-amplifier 71, which amplifies the read data signal. Buffer 72 stores the read data signal from pre-amplifier 71 and outputs the read data signal that has been stored to output data amplifiers 1A and 1B respectively included in exclusive circuits 2 and 3, under the control of an input/output control circuit (not shown). Output data amplifiers 1A and 1B amplify the read data signal to output the signal to output buffer 80. Output buffer 80 outputs the read data signal to an input/output terminal DQ.

In common signal circuit 70, the read data signal which is read from a memory cell is input from an input I/O line 73, amplified by pre-amplifier 71 and stored by buffer 72. Common signal circuit 70 outputs the read data signal to output data amplifier 1A in exclusive circuit 2 or to output data amplifier 1B in exclusive circuit 3, under the control of input/output control circuit (not shown). Output data amplifier 1A or 1B amplifies the read data signal and outputs the signal to output buffer 80, which in turn outputs the read data signal to an input/output terminal DQ. Therefore, common signal circuit 70 in common circuit 1 outputs, for example, the read data signal to output data amplifier 1A or 1B to activate exclusive circuit 2 or 3, and outputs the read data signal to the outside.

Again referring to FIG. 12, when semiconductor memory device 300 is produced as the SDR-SDRAM, switch 61 is connected to node 62, inactivation/activation circuit 60 outputs, to node N7, inactivation signal DASL fixed to the ground voltage, and common signal circuit 70 outputs common signal SigD to node N1. Switch 74 is connected to node N1. Further, power-supply node 55 is supplied with the external power-supply voltage of 3.3V. In this case, though inactivation/activation circuit 20 outputs inactivation signal DASL to node N4, inactivation signal DASL is not input to exclusive circuit 2 since switch 74 is not connected to node N4.

Then, inactivation signal DASL and common signal SigD are input to exclusive circuit 3, and a voltage of 0V is applied to the gate terminals of P-channel MOS transistor 52 and N-channel MOS transistor 53 in NAND gate 50. Further, common signal SigD is applied to the gate terminals of P-channel MOS transistor 51 and N-channel MOS transistor 54. As a result, P-channel MOS transistor 52 is turned on while N-channel MOS transistor 53 is turned off, so that NAND gate 50 outputs, to node N8, a constant signal fixed to the external power-supply voltage of 3.3V, independent of the level (H or L) of common signal SigD which is the other input signal. N-channel MOS transistor 53 is turned off, and thus no through current will flow in NAND gate 50. As a result, exclusive circuit 3 is inactivated and generation of the through current is prevented.

In exclusive circuit 2, common signal SigD is input from common signal circuit 70, and inverter IV5 outputs a signal based on common signal SigD, and then exclusive circuit 2 is activated.

Figure 14:
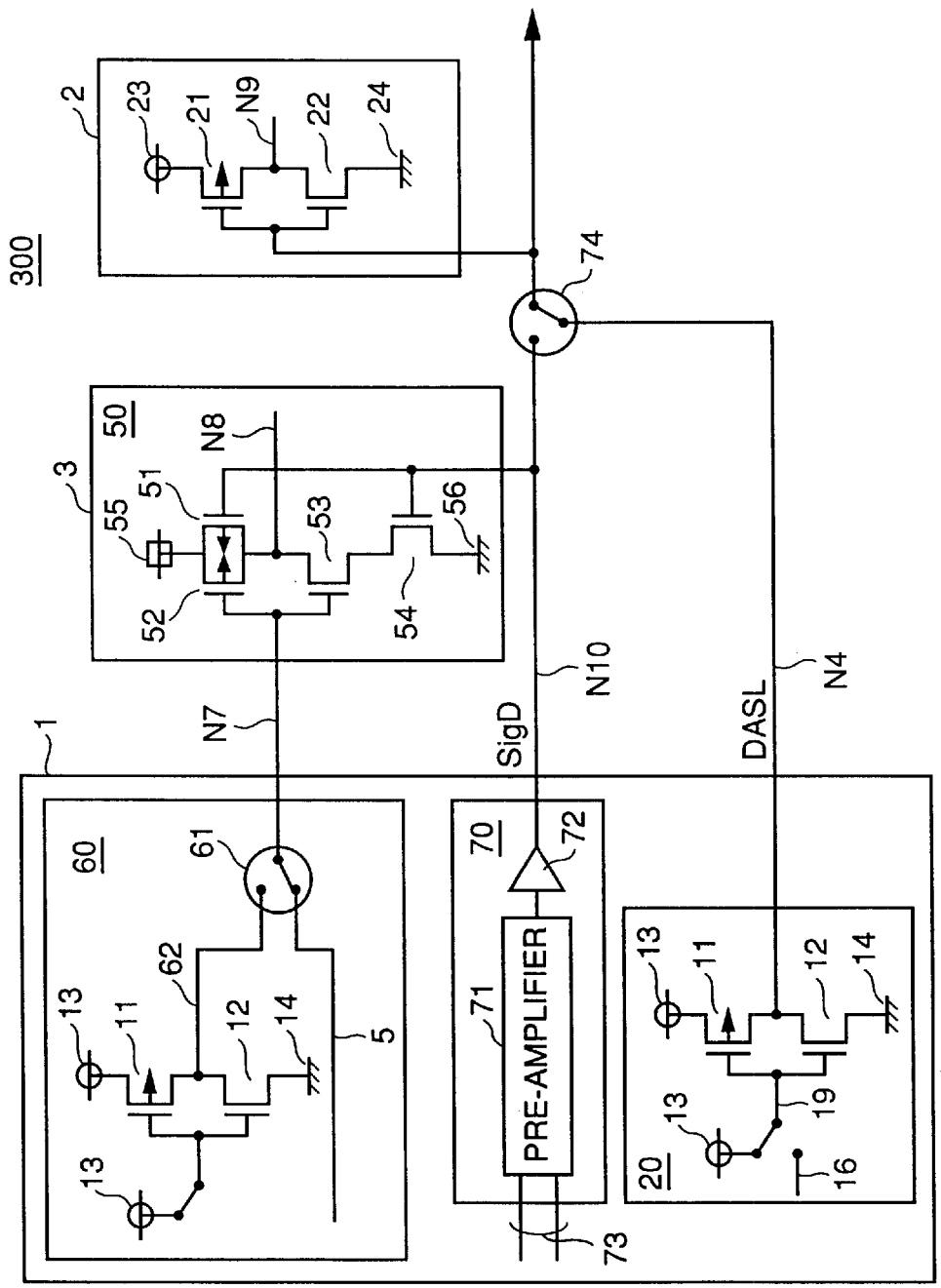
FIG. 14 is a circuit diagram of a common circuit and an exclusive circuit included in the semiconductor memory device according to the third embodiment.

Referring to FIG. 14, when semiconductor memory device 300 is produced as the DDR-SDRAM, switch 61 is connected to external power-supply line 5, so that inactivation/activation circuit 60 outputs a signal of level H having a voltage value of 2.5V to node N7. Inactivation/activation circuit 20 outputs inactivation signal DASL to node N4, while common circuit 70 outputs common signal SigD to node N10. Switch 74 is connected to node N4.

Then, in exclusive circuit 3, P-channel MOS transistor 52 is turned off while N-channel MOS transistor 53 is turned on in NAND gate 50. Common signal SigD is applied to the gate terminals of P-channel MOS transistor 51 and N-channel MOS transistor 54, so that NAND gate 50 outputs a signal based on common signal SigD to node N8. Thus, when common signal SigD is of level H, P-channel MOS transistor 51 is turned off while N-channel MOS transistor 54 is turned on, and NAND gate 50 outputs a signal of level L to node N8. Further, when common signal SigD is of level L, P-channel MOS transistor 51 is turned on while N-channel MOS transistor 54 is turned off, and NAND gate 50 outputs a signal of level H to node N8. Therefore, NAND gate 50 outputs a signal inverted from common signal SigD, thus activating exclusive circuit 3.

On the other hand, inactivation signal DASL is input from inactivation/activation circuit 20 to exclusive circuit 2, which is thus inactivated as described earlier, and generation of the through current therein is prevented.

Figure 15:
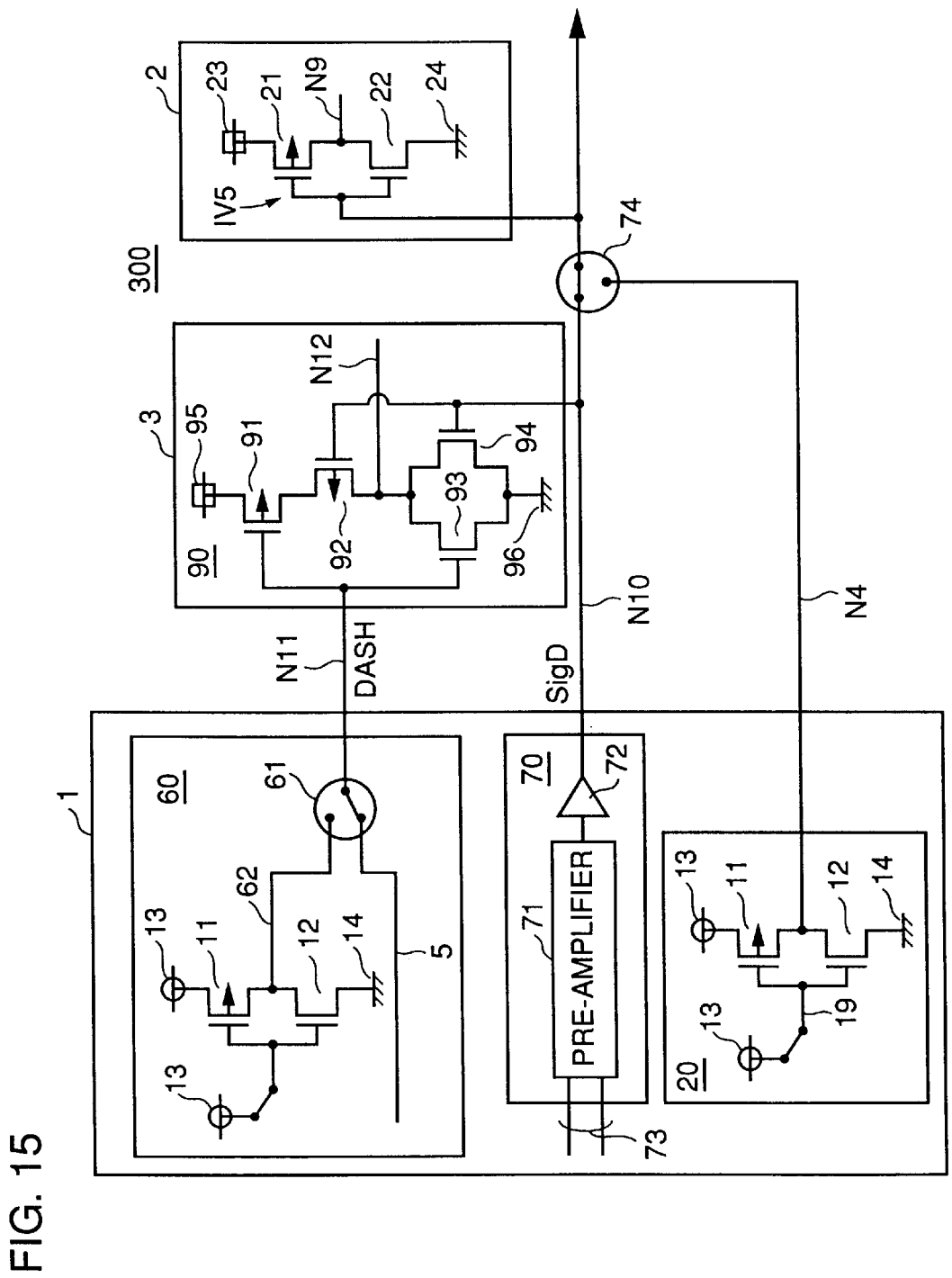
FIG. 15 is a circuit diagram of another common circuit and the exclusive circuit included in the semiconductor memory device according to the third embodiment.

Referring to FIG. 15, semiconductor memory device 300 according to the third embodiment may employ an exclusive circuit 3 including an NOR gate 90 in place of NAND gate 50. NOR gate 90 includes P-channel MOS transistors 91, 92 and N-channel MOS transistors 93, 94. NOR gate 90 is provided between a power-supply node 95, supplied with an external voltage, and a ground terminal 96.

When semiconductor memory device 300 is produced as an SDR-SDRAM, switch 61 is connected to external power-supply line 5 and switch 74 is connected to node N1. Switch 61 then outputs inactivation signal DASH fixed to the external power-supply voltage of 3.3V to node N11, and common signal circuit 70 outputs common signal SigD to node N10. In exclusive circuit 3, inactivation signal DASH is input from node N11, and common signal SigD is input from node N1. Further, in exclusive circuit 2, common signal SigD is input from node N10.

In NOR gate 90, P-channel MOS transistor 91 is completely turned off while N-channel MOS transistor 93 is turned on. NOR gate 90 then outputs a constant signal fixed to 0V to node N12, independent of the level (H or L) of common signal SigD. No through current flows in NOR gate 90 since P-channel MOS transistor 91 is completely turned off. Thus, when inactivation signal DASH is input, exclusive circuit 3 is inactivated, and generation of through current is prevented.

Common signal SigD is input to exclusive circuit 2 at node N10 via switch 74, thus activating exclusive circuit 2 as described earlier.

Figure 16:
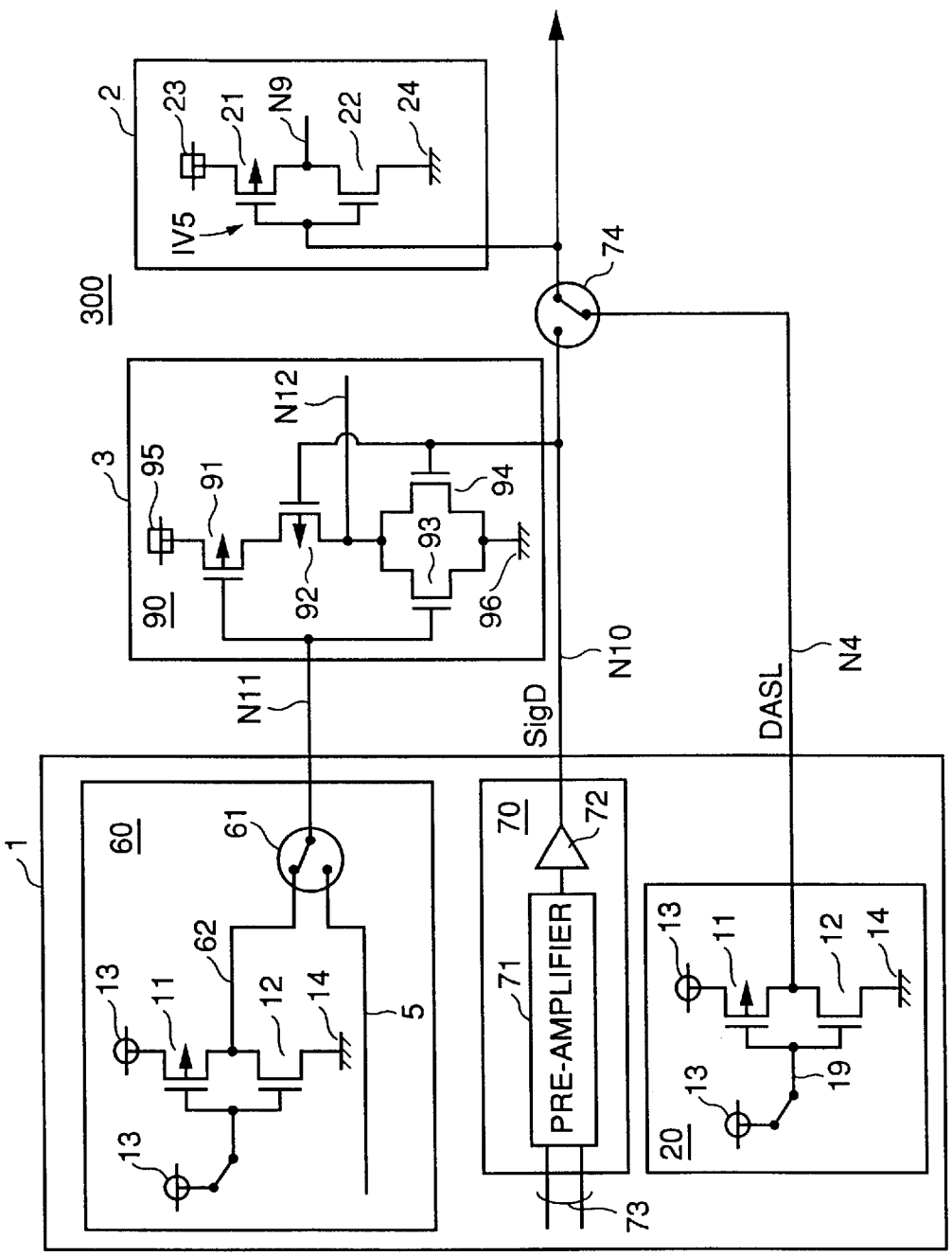
FIG. 16 is a circuit diagram of another common circuit and the exclusive circuit included in the semiconductor memory device according to the third embodiment.

Referring to FIG. 16, when semiconductor memory device 300 is produced as a DDR-SDRAM, switch 61 is connected to node 62, and switch 74 is connected to node N4. Switch 61 then outputs a signal of level L having a voltage value of 0V to node N11, common signal circuit 70 outputs common signal SigD to node N10, and inactivation/activation circuit 20 outputs inactivation signal DASL to node N4.

In NOR gate 90, a signal of level L is applied to the gate terminals of P-channel MOS transistor 91 and N-channel MOS transistor 93, and signal SigD is applied to the gate terminals of P-channel MOS transistor 92 and N-channel MOS transistor 94. As a result, NOR gate 90 outputs a signal based on common signal SigD to node N12. Thus, in NOR gate 90, when common signal SigD is of level H, P-channel MOS transistor 92 is turned off while N-channel MOS transistor 94 is turned on, and NOR gate 90 outputs a signal of level L to node 12. When common signal SigD is of level L, P-channel MOS transistor 92 is turned on while N-channel MOS transistor 94 is turned off, and NOR gate 90 outputs a signal of level H to node N12. Therefore, exclusive circuit 3 outputs a signal based on common signal SigD to node N12 to be activated.

On the other hand, exclusive circuit 2 is inactivated as described earlier, since inactivation signal DASL is input from node N4 via switch 74, and thus generation of the through current is prevented.

Though it has been described above that exclusive circuit 2 includes inverter IV5 at the input portion thereof, exclusive circuit 2 may instead include NAND gate 50 or NOR gate 90 at the input portion thereof as in exclusive circuit 3. In that case, switch 74 can be dispensed with.

According to the third embodiment, in semiconductor memory device 300, exclusive circuit 2 includes an inverter in which a P-channel MOS transistor and an N-channel MOS transistor are connected with each other in series between power-supply node 23 supplied with the external power-supply voltage by external power-supply line 5 and ground terminal 24, or includes an NAND gate or NOR gate having an arrangement in which a P-channel MOS transistor and an N-channel MOS transistor are serially connected with each other. Exclusive circuit 3 includes an inverter in which a P-channel MOS transistor and an N-channel MOS transistor are connected with each other in series between power-supply node 95 supplied with the external power-supply voltage by external power-supply line 5 and ground terminal 96, or includes an NAND gate or NOR gate having an arrangement in which a P-channel MOS transistor and an N-channel MOS transistor are serially connected with each other. Common circuit 1 outputs, to exclusive circuits 2 and 3, inactivation signal DASL fixed to the ground voltage (0V) or inactivation signal DASH fixed to the external power-supply voltage of 3.3V other then common signal SigD which is also output to exclusive circuits 2 and 3. Therefore, an exclusive circuit unnecessary for forming the semiconductor memory device is inactivated by reducing the number of interconnections for common signals, preventing the through current from flowing in the inactivated exclusive circuit. This can also reduce the chip area.

Fourth Embodiment

Figure 17:
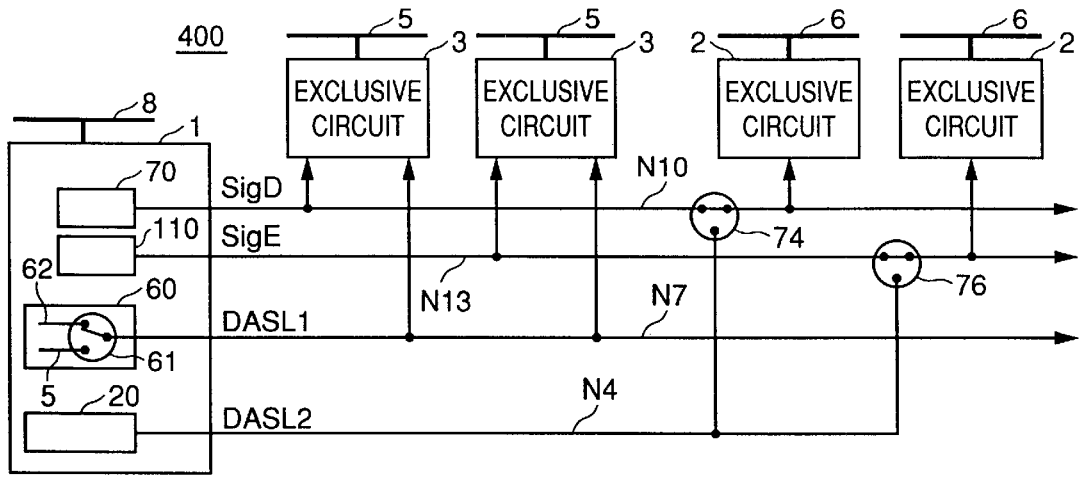
FIG. 17 is a schematic block diagram of a semiconductor memory device according to the fourth embodiment.

Referring to FIG. 17, a semiconductor memory device 400 according to the fourth embodiment includes a common circuit 1, exclusive circuits 2, 3, and switches 74, 76. Common circuit 1 includes inactivation/activation circuits 20, 60 and common signal circuits 70, 110. A plurality of exclusive circuits 2 and 3 are provided. The configuration of semiconductor memory device 400 is the same for the rest as that of semiconductor memory device 300. Common signal circuit 110 outputs a signal SigE to exclusive circuits 2 and 3. Common signal circuit 110 includes, for example, a pre-amplifier 71 and a buffer 72 shown in FIG. 13, and amplifies/stores a read data signal which is read from a memory cell (not shown) to output the signal to output data amplifiers 1A and 1B in exclusive circuits 2 and 3.

When semiconductor memory device 400 is produced as an SDR-SDRAM, switch 61 is connected to node 62, switch 74 is connected to node N10, and switch 76 is connected to node N13.

Inactivation/activation circuit 60 then outputs inactivation signal DASL1 to node N7, common signal circuit 70 outputs common signal SigD to node N10, and common signal circuit 110 outputs common signal SigE to node N13. In this case, though inactivation/activation circuit 20 outputs inactivation signal DASL2 to node N4, no inactivation signal DASL is input to exclusive circuits 2, 2, since switches 74 and 76 are not connected to node N4.

Thus, inactivation signal DASL1 and common signal SigD are input to one of two exclusive circuits 3, 3, while inactivation signal DASL1 and common signal SigE are input to the other exclusive circuit 3. NAND gate 50 included at each input portion of two exclusive circuits 3, 3 outputs a constant signal fixed to level H, independent of the levels (H or L) of common signal SigD or SigE, as described above. Therefore, two exclusive circuits 3, 3 are inactivated and generation of the through current is prevented.

Common signal SigD is input to one of two exclusive circuits 2, 2, while common signal SigE is input to the other exclusive circuit 2. Two exclusive circuits 2, 2 include an inverter IV5 at each input portion thereof, inverter IV5 outputting a signal based on common signal SigD or SigE as described above. Thus, two exclusive circuits 2, 2 are activated.

Figure 18:
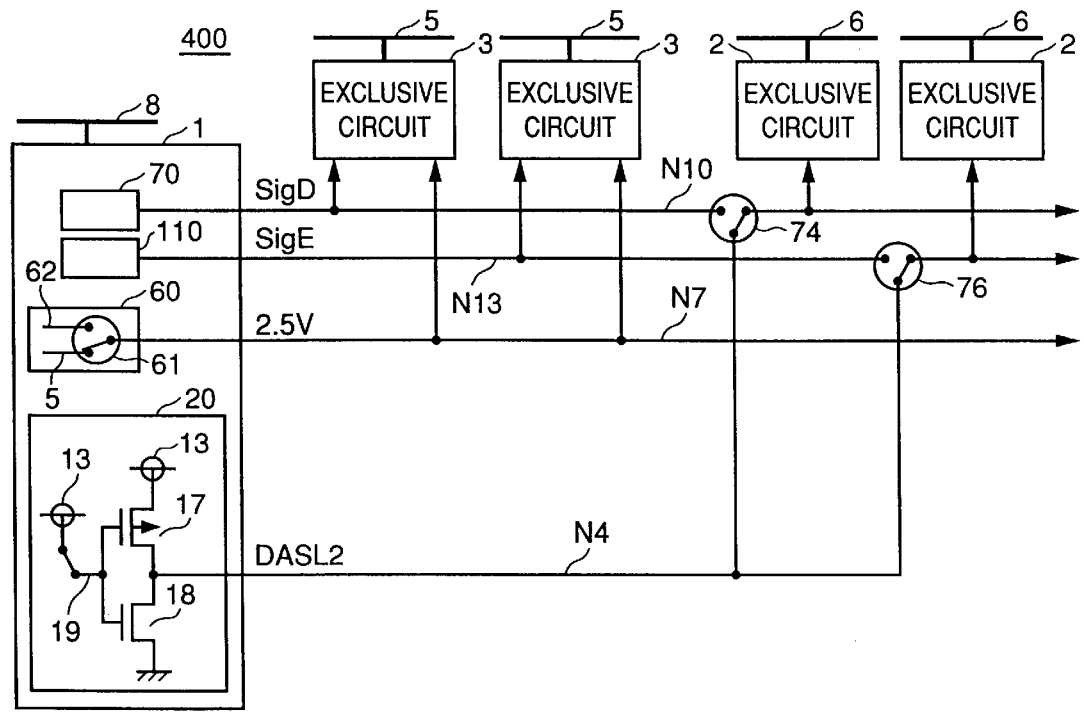
FIG. 18 is a schematic block diagram of the semiconductor memory device according to the fourth embodiment.
Figure 19:
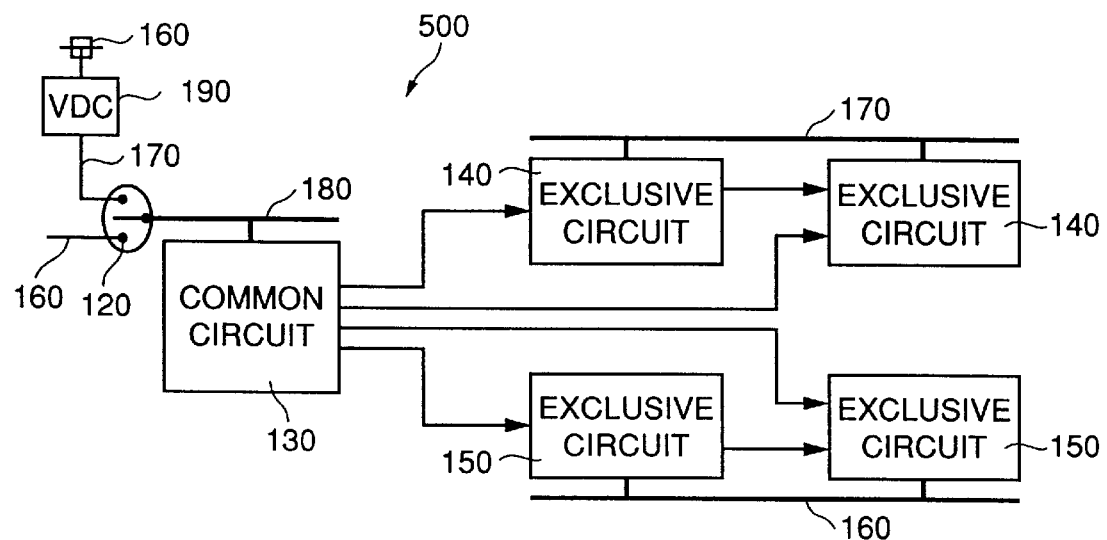
FIG. 19 is a schematic block diagram of the semiconductor memory device selectively producing products having different external power-supplies.
Figure 20:
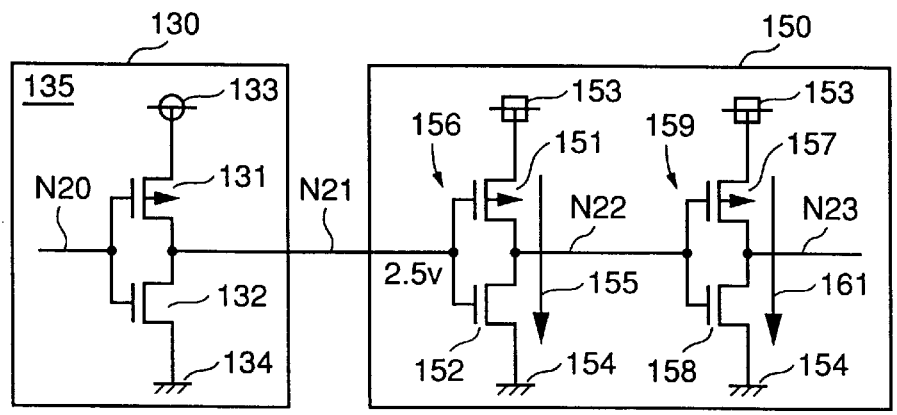
FIG. 20 is a circuit diagram of a common circuit and an exclusive circuit of the semiconductor memory device shown in FIG. 19.
Figure 21:
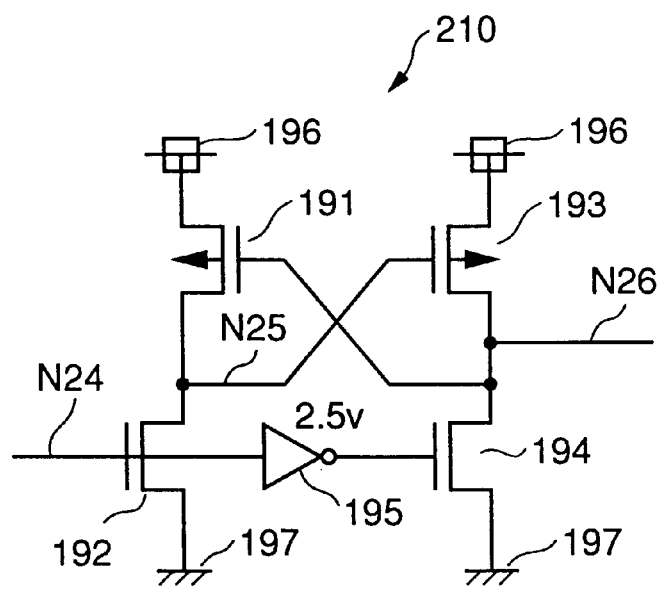
FIG. 21 is a circuit diagram of a voltage converter.

Referring to FIG. 18, when semiconductor memory device 400 is produced as a DDR-SDRAM, switch 61 is connected to external power-supply line 5, and switches 74 and 76 are connected to node N4.

Common signal circuit 70 then outputs common signal SigD to node N10, while common signal circuit 110 outputs common signal SigE to node N13. Inactivation/activation circuit 20 outputs an inactivation signal DASL2 to node N4, and inactivation/activation circuit 60 outputs a signal of level H fixed to the external power-supply voltage of 2.5V to, node N7.

Therefore, a signal of level H and common signal SigD are input to one of the two exclusive circuits 3, 3, while a signal of level H and common signal SigE are input to the other exclusive circuit 3. Then, NAND gate 50 included in each input portion of two exclusive circuits 3, 3 outputs a signal based on common signal SigD or SigE, and thus two exclusive circuits 3, 3 are activated.

On the other hand, inactivation signal DASL2 is input to two exclusive circuits 2, 2, so that inverter IV5 included in each of two exclusive circuits 2, 2 outputs a constant signal fixed to level H or L, as described earlier. Two exclusive circuits 2, 2 are thus inactivated and generation of through current is prevented.

In semiconductor memory device 400, each of two exclusive circuits 3, 3 may include an NOR gate in place of an NAND gate at the input portion thereof. In such a case, switch 61 of inactivation/activation circuit 60 is connected to external power-supply line 5 when semiconductor memory device 400 is produced as an SDR-SDRAM, while it is connected to node 62 when semiconductor memory device 400 is produced as a DDR-SDRAM.

Though it has been described above that exclusive circuit 2 includes inverter IV5 at the input portion thereof, exclusive circuit 2 may instead include NAND gate 50 or NOR gate 90 as in exclusive circuit 3. In that case, switches 74 and 76 are dispensed with.

According to the fourth embodiment, exclusive circuit 2 includes an inverter in which a P-channel MOS transistor and an N-channel MOS transistor are connected with each other in series between power-supply node 23 supplied with the external power-supply voltage by external power-supply line 5 and ground terminal 24, or includes an NAND gate or NOR gate having an arrangement in which a P-channel MOS transistor and an N-channel MOS transistor are serially connected with each other. Exclusive circuit 3 includes an inverter in which a P-channel MOS transistor and an N-channel MOS transistor are connected with each other in series between power-supply node 95 supplied with the external power-supply voltage by external power-supply line 5 and ground terminal 96, or includes an NAND gate or NOR gate having an arrangement in which a P-channel MOS transistor and an N-channel transistor are serially connected with each other. Common circuit 1 outputs, to exclusive circuits 2 and 3, inactivation signals DASL 1, 2 fixed to the ground voltage (0V) or inactivation signal DASH fixed to the external power-supply voltage of 3.3V, other then common signal SigD which is also output to exclusive circuits 2 and 3. Therefore, an exclusive circuit unnecessary for forming the semiconductor memory device is inactivated by reducing the number of interconnections for common signals, preventing the through current from flowing in the inactivated exclusive circuit. This can also reduce the chip area.

It is noted that, though the internal power-supply voltage of 2.5V which has been down-converted from the external power-supply voltage of 3.3V is equal to the external power-supply voltage of 2.5V in the first to fourth embodiments, the present invention is not limited thereto, but the internal power-supply voltage which has been down-converted from one external power-supply voltage may be different from the other external power-supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device functioning as a first semiconductor memory device operating at a first external power-supply voltage or as a second semiconductor memory device operating at a second external power-supply voltage lower than said first external power-supply voltage, said first semiconductor memory device including
     an external power-supply line supplied with said first external power-supply voltage,
     a voltage down converter connected to said external power-supply line and down-converts said first external power-supply voltage to an internal power-supply voltage,
     an internal power-supply line connected to said voltage down converter,
     a switch connected to said internal power-supply line,
     a first circuit connected to said switch and operating at said internal power-supply voltage,
     a second circuit connected to said internal power-supply line and operating at said internal power-supply voltage, and
     a third circuit connected to said external power-supply line and includes, at an input portion thereof, a circuit in which an N-channel MOS transistor or a P-channel MOS transistor is arranged between said external power-supply line and a ground terminal,
   said first circuit outputting a first functional signal to said second circuit and applying a first inactivation signal fixed to a ground voltage or a second inactivation signal fixed to-said first external power-supply voltage to gate terminal of said N-channel MOS transistor or said P-channel MOS transistor,
   said second semiconductor memory device including
     an external power-supply line supplied with said second external power-supply voltage,
     a switch connected to said external power-supply line,
     a first circuit connected to said switch and operating at said second external power-supply voltage,
     a second circuit connected to said switch, and
     a third circuit connected to said external power-supply line and operating at said second external power-supply voltage,
   said first circuit outputting a second functional signal to said third circuit.

2. The semiconductor memory device according to claim 1, wherein
   said third circuit in said first semiconductor memory device includes, at an input portion thereof, an N-channel MOS transistor and a P-channel MOS transistor connected with each other in series between said external power-supply line and the ground terminal, and
   said first circuit in said first semiconductor memory device applies said first inactivation signal or said second inactivation signal to gate terminals of said N-channel MOS transistor and said P-channel MOS transistor.

3. The semiconductor memory device according to claim 1, wherein
   said second circuit in said second semiconductor memory device includes, at an input portion thereof, an N-channel MOS transistor and a P-channel MOS transistor connected with each other in series between said external power-supply line and the ground terminal, and
   said first circuit in said second semiconductor memory device applies said first inactivation signal or a third inactivation signal fixed to said second external power-supply voltage to gate terminals of said N-channel MOS transistor and said P-channel MOS transistor.

4. The semiconductor memory device according to claim 1, wherein said first circuit in said first semiconductor memory device applies said first inactivation signal generated based on said internal power-supply voltage to said gate terminals.

5. The semiconductor memory device according to claim 4, wherein said first circuit includes an inverter generating said first inactivation signal based on said internal power-supply voltage.

6. The semiconductor memory device according to claim 1, wherein said third circuit in said first semiconductor memory device includes, at an input portion thereof, an inverter to which said first or second inactivation signal is input.

7. The semiconductor memory device according to claim 1, wherein
   said third circuit in said first semiconductor memory device includes a pulse generating circuit including
     a plurality of inverters connected with each other in series, to which said first or second inactivation signal is input, and
     an NOR gate to which said first or second inactivation signal and an output signal of said plurality of inverters are input.

8. The semiconductor memory device according to claim 7, wherein
   said plurality of inverters include an odd number of inverters, and
   said odd number of inverters and said NOR gate receive said first inactivation signal.

9. The semiconductor memory device according to claim 1, wherein said first circuit in said first semiconductor memory device includes
an inactivation circuit outputting said first inactivation signal, and
a common signal circuit outputting a common signal to said second and third circuits, and
said third circuit includes, at an input portion thereof, an NAND gate or an NOR gate.

10. The semiconductor memory device according to claim 9, wherein
said inactivation circuit includes
an inverter generating said first inactivation signal based on said internal power-supply voltage, and
a third switch connected to said inverter.

11. The semiconductor memory device according to claim 9, wherein
a plurality of said second and third circuits are provided, and
said common signal circuit outputs two common signals to each of said plurality of second and third circuits.

12. The semiconductor memory device according to claim 9, wherein said common signal circuit outputs a read data signal.

13. The semiconductor memory device according to claim 1, wherein said switch is provided by an interconnection mask in a step of master slicing.

* * * * *